United States Patent
Hsu et al.

(10) Patent No.: US 6,801,456 B1
(45) Date of Patent: Oct. 5, 2004

(54) METHOD FOR PROGRAMMING, ERASING AND READING A FLASH MEMORY CELL

(75) Inventors: Ching-Hsiang Hsu, Hsin-Chu (TW); Chih-Hsun Chu, Hsin-Chu (TW); Jih-Wen Chou, Hsin-Chu (TW); Cheng-Tung Huang, Kao-Hsiung (TW)

(73) Assignee: eMemory Technology Inc., Hsin-Chu City (TW)

( * ) Notice: Subject to any disclaimer, the term of this patent is extended or adjusted under 35 U.S.C. 154(b) by 0 days.

(21) Appl. No.: 10/707,474

(22) Filed: Dec. 17, 2003

(30) Foreign Application Priority Data

Aug. 6, 2003 (TW) ........................................ 92121550 A

(51) Int. Cl.$^7$ ........................... G11C 16/04; G11C 16/06
(52) U.S. Cl. ........................... 365/185.18; 365/185.24; 365/185.27; 365/185.29
(58) Field of Search ................ 365/185.18, 185.24, 365/185.26, 185.27, 185.28, 185.29, 185.33

(56) References Cited

U.S. PATENT DOCUMENTS

| | | | | |
|---|---|---|---|---|
| 5,455,790 A | * | 10/1995 | Hart et al. .............. | 365/185.29 |
| 5,706,227 A | * | 1/1998 | Chang et al. .......... | 365/185.18 |
| 5,901,084 A | * | 5/1999 | Ohnakado .............. | 365/185.18 |
| 6,172,397 B1 | * | 1/2001 | Oonakado et al. ..... | 365/185.26 |
| 6,606,265 B2 | * | 8/2003 | Bergemont et al. .... | 365/185.33 |
| 6,643,186 B2 | * | 11/2003 | Tuan et al. ............. | 365/185.33 |

OTHER PUBLICATIONS

C.C.-H. Hsu, et al. ; A High Speed, Low Power P–Channel Flash EEPROM Using Silicon Rich Oxide as Tunneling Dielectric; Extended Abstracts of the 1992 International Conference on Solid State Device and Materials, Tsukuba, 1992, pp. 140–142.

* cited by examiner

Primary Examiner—Trong Phan
(74) Attorney, Agent, or Firm—Winston Hsu

(57) ABSTRACT

A method for programming PMOS single transistor flash memory cells through channel hot carrier induced hot electron injection mechanism is disclosed. The PMOS single transistor flash memory cell includes an ONO stack layer situated on an N-well of a semiconductor substrate, a P$^+$ poly gate formed on the ONO stack layer, a P$^+$ doped source region disposed in the N-well at one side of the gate, and a P$^+$ doped drain region disposed in the N-well at the other side of the gate. The method includes the steps of: applying a word line voltage $V_{WL}$ on the P$^+$ poly gate, applying a source line voltage $V_{SL}$ on the source, wherein the source line voltage $V_{SL}$ is greater than the word line voltage $V_{WL}$, thereby providing adequate bias to turn on the P channel thereof. A bit line voltage that is smaller than the source line voltage $V_{SL}$ is applied on the P$^+$ doped drain region, thereby driving channel hot holes to flow toward the P$^+$ doped drain region and then inducing hot electron injection near the drain side. A well voltage $V_{NW}$ is applied to the N-well, wherein $V_{NW}=V_{SL}$.

15 Claims, 20 Drawing Sheets

OPERATION VOLTAGE TABLE

|  | Selected BL | | | Un-Selected BL | | | |
| --- | --- | --- | --- | --- | --- | --- | --- |
|  | $V_{WL}$ | $V_{BL}$ | $V_{SL}$ | $V_{WL}$ | $V_{BL}$ | $V_{SL}$ | $V_{NW}$ |
| PROGRAM | -2V | -5V | 0V | 1V | 0V | FL or 0V | 0V |
| ERASE | -6V | 0V | 0V | 0V | 0V | 0V | 6V |
| READ | 0V | 0V | -2V | 2V | -2V | -2V | 0V |

Fig. 8

OPERATION VOLTAGE TABLE

|  | Selected BL | | | Un-Selected BL | | | |
|---|---|---|---|---|---|---|---|
|  | $V_{WL}$ | $V_{BL}$ | $V_{SL}$ | $V_{WL}$ | $V_{BL}$ | $V_{SL}$ | $V_{NW}$ |
| PROGRAM | 5V | -4V | FL | 0V | FL | FL | 2V |
| ERASE | -6V | 0V | 0V | 0V | 0V | 0V | 6V |
| READ | 0V | 0V | -2V | 2V | -2V | -2V | 0V |

Fig. 13

METHOD FOR PROGRAMMING, ERASING AND READING A FLASH MEMORY CELL

BACKGROUND OF INVENTION

1. Field of the Invention

The present invention relates to a method for operating a flash memory, more specifically, to a method for programming, erasing and reading a single-transistor P-channel flash memory.

2. Description of the Prior Art

For the past decade, technology and application of flash memory cells has gradually expanded with an increase of portable devices. Since portable devices usually use batteries as a power source, reduction in energy dissipation and operating the flash memory cell at optimum conditions are main areas of research in memory cell development. Generally, the flash memory cell is divided into a P-channel and an N-channel. The P-channel flash memory cell has characteristics of low power consumption, low programming voltage, and fast programming, so that the P-channel flash memory cell has been adapted to be used in a field of portable devices. Programming methods for the P-channel flash memory cell can be divided into three kinds: channel hot hole induced hot electron programming, band-to-band tunneling (BTBT), and Fowler-Nordheim (FN) tunneling.

In 1992, Hsu et al. in an article entitled "A High Speed, Low Power P-Channel Flash EEPROM Using Silicon Rich Oxide as Tunneling Dielectric", International Conference on Solid State Devices and Materials (SSDM), 1992, pp.140–142, which is incorporated herein by reference, disclosed that by using silicon rich oxide (SRO) as tunneling dielectric in P-channel EEPROM cell, a high speed, low power and low voltage flash EEPROM can be accomplished. The hot electron injection in P-channel cell can be 2 orders in magnitude greater than that in N-channel cell, while the channel current during programming in P-channel cell is 2 orders in magnitude less than that in N-channel cell.

T. Ohnakado et al. in an article entitled "Novel Electron Injection Method Using Band-to-Band Tunneling Induced Hot Electron (BBHE) for Flash Memory with a P-channel Cell", IEEE International Electron Devices Meeting Technical Digest, 1995, pp.279–282, disclosed a PMOS floating gate (FG) memory cell. A PMOS FG cell is formed in an N-well region of a P substrate. A P$^+$ source and a P$^+$ drain are formed in the N-well region. Dopants of the N typeare implanted into a channel region to realize an enhancement mode device. An N type polysilicon floating gate is insulated from the N-well region by a tunneling oxide layer. A control gate is insulated from the floating gate by another insulating layer. The cell is programmed by applying a high positive voltage of about 10 volts to the control gate, approximately −6 volts to the P$^+$ drain, floating the P$^+$ source, and grounding the N-well region. Under these bias conditions, hot electrons induced by band-to-band tunneling (BTBT) are injected into the floating gate. The resultant accumulation of charge on the floating gate increases the threshold voltage $V_T$ of the cell to approximately −2.5 volts. Thus, when programmed, the cell operates as an enhancement mode device.

Please refer to FIG. 1. FIG. 1 is a cross-sectional diagram of a prior art typical P-channel flash memory cell 10' in a programming mode. As shown in FIG. 1, the P-channel flash memory cell 10' is comprised of an N-type doped substrate 12', an N-type doped control gate 14', an N-type doped floating gate 16', a P$^+$ source 17', a P$^+$ drain 18', a tunneling oxide layer 21' located between the floating gate 16' and the substrate 12', and an oxide-nitride-oxide (ONO) dielectric layer 22' located between the control gate 14' and the floating gate 16'.

In a general band-to-band tunneling (BTBT) programming mode, a positive high voltage of 10 volts is provided to the control gate 14', a negative voltage of −6 volts is provided to the drain 18', the substrate 12' in grounded, and the source 17' is in a floating state. In programming mode, electron-hole pairs are generated by band-to-band tunneling in a region where the drain 18' and the floating gate 16' overlap. The generated electrons are repelled into the channel region under the floating gate 16'. Some electrons get enough energy to overcome an energy barrier of the tunneling oxide layer 21' and inject into the floating gat 16'. Please note that programming efficiency and tunneling probability of electrons of the BTBT mechanism are related to an energy gap in the valance band-conduction band (EV-EC) in the region where the drain 18' and the floating gate 16' overlap. The smaller the energy gap is, the greater the band-to-band tunneling probability of electrons will be present.

SUMMARY OF INVENTION

It is a primary objective of the present invention to provide a low-voltage program, read and erase method for P-channel single-transistor flash memory cell.

According to the claimed invention, a method for programming a PMOS single-transistor memory unit is disclosed. The PMOS single-transistor memory unit is comprised of a silicon dioxide-silicon nitride-silicon dioxide (ONO) dielectric stack disposed on an N-well, a P type polysilicon gate disposed on the ONO dielectric stack, a P type doped source region disposed in the N-well at one side of the P type polysilicon gate, and a P type doped drain region disposed in the N-well on the other side of the P type polysilicon gate. The method comprises: biasing said P type polysilicon gate of said PMOS single-transistor memory unit to a word line voltage $V_{WL}$; biasing said P type doped source region of said PMOS single-transistor memory unit to a source line voltage $V_{SL}$ that is greater than the word line voltage $V_{WL}$, wherein $|V_{WL}-V_{SL}|$ is larger than threshold voltage of said PMOS single-transistor memory unit, so as to provide an adequate gate-to-source bias to turn on a P-channel 16 of said PMOS single-transistor memory unit; biasing said P type doped drain region of said PMOS single-transistor memory unit to a bit line voltage $V_{BL}$, wherein said bit line voltage $V_{BL}$ is smaller than said source line voltage $V_{SL}$, so as to provide a lateral electric field for P-channel hot holes, wherein said lateral electric field forces said P-channel hot holes passing through said P-channel in an accelerated drifting rate to said P type doped drain region, thereby inducing hot electrons near said P type doped drain region, and wherein some of induced hot electrons inject into said ONO dielectric stack; and biasing said N-well to a well voltage $V_{NW}$, wherein said well voltage $V_{NW}$ is equal to said source line voltage $V_{SL}$.

In accordance with one preferred embodiment of this invention, the word line voltage $V_{WL}$ is between 0~4V, the source line voltage $V_{SL}$ is between 3~5V, the bit line voltage $V_{BL}$ is 0V, and the well voltage $V_{NW}$ is between 3~5V. In accordance with another preferred embodiment of this invention, the word line voltage $V_{WL}$ is between −1~−5V, the source line voltage $V_{SL}$ is 0V, the bit line voltage $V_{BL}$ is between −3~−5V, and the well voltage $V_{NW}$ is between 0V.

According to one aspect of the present invention, a method for programming a PMOS single-transistor memory unit based on band-to-band tunneling mechanism is disclosed. The PMOS single-transistor memory unit is comprised of a silicon dioxide-silicon nitride-silicon dioxide (ONO) dielectric stack disposed on an N-well, a P type polysilicon gate disposed on the ONO dielectric stack, a P type doped source region disposed in the N-well at one side of the P type polysilicon gate, and a P type doped drain region disposed in the N-well on the other side of the P type polysilicon gate. The method comprises: biasing said P type polysilicon gate of said PMOS single-transistor memory unit to a word line voltage $V_{WL}>0V$; floating said P type doped source region of said PMOS single-transistor memory unit; and biasing said P type doped drain region of said PMOS single-transistor memory unit to a bit line voltage $V_{BL}$ and biasing said N-well to a well voltage $V_{NW}$, wherein $V_{NW}-V_{BL}$ bias>0V. For example, the word line voltage $V_{WL}$ is between 2~8V, the bit line voltage $V_{BL}$ is -3~-6V, and the well voltage $V_{NW}$ is between 0~5V.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 8 is a voltage condition table including operation voltages for programming, reading and erasing the PMOS single-transistor memory cell according to the preferred embodiment of this invention;

FIG. 13 is a voltage condition table including operation voltages for BTBT programming, reading and erasing the PMOS single-transistor memory cell according to another preferred embodiment of this invention;

DETAILED DESCRIPTION

Single-transistor P-channel flash memory cell unit and an array of the single-transistor P-channel flash memory cells according to preferred embodiments of the present invention as well as the data programming, erasing and reading operations using the same are now explained in detail by referring to FIGS. 2–18.

Figure 1:
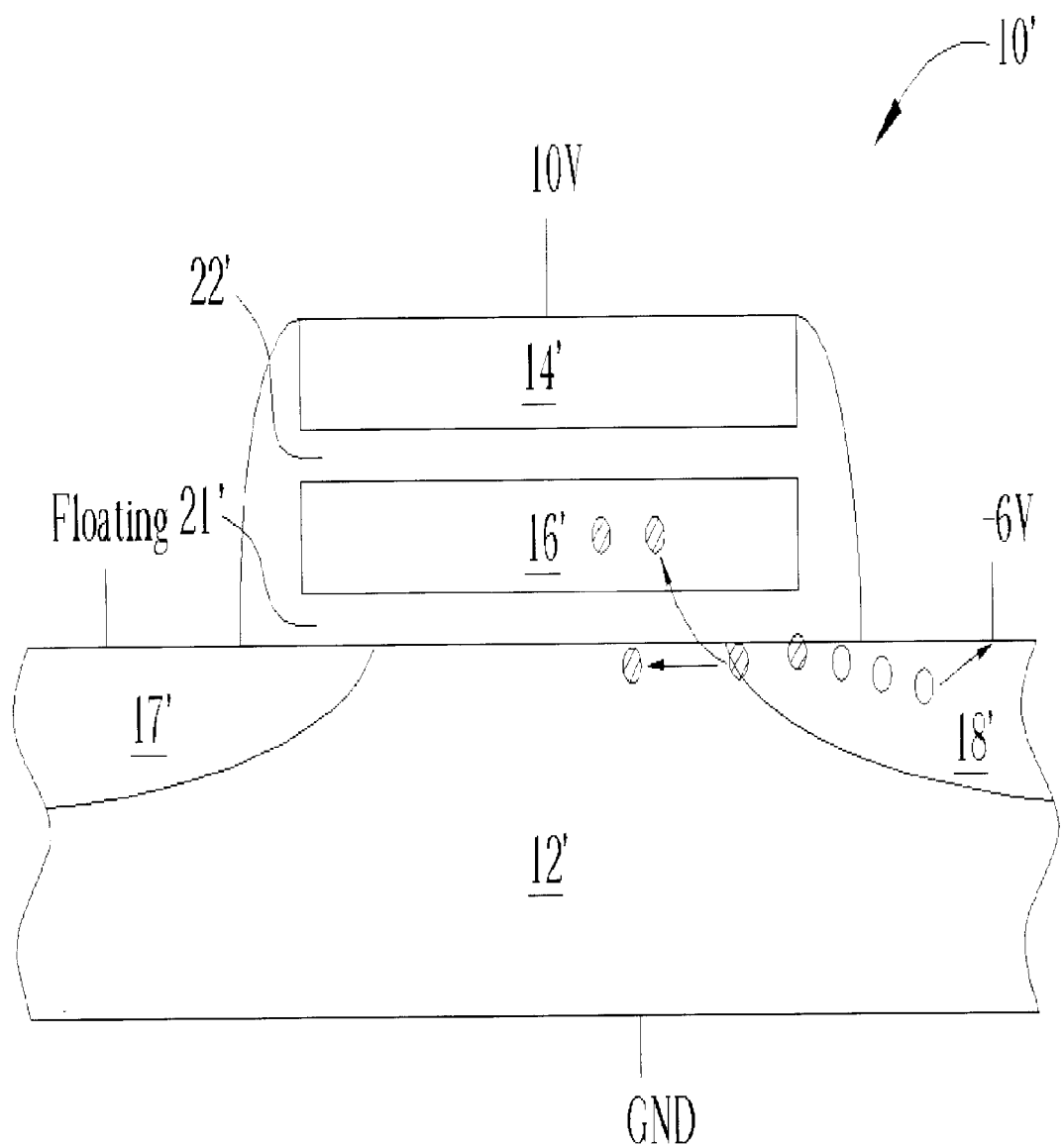
FIG. 1 is a cross-sectional diagram of a prior art typical P-channel flash memory cell in a programming mode.
Figure 2:
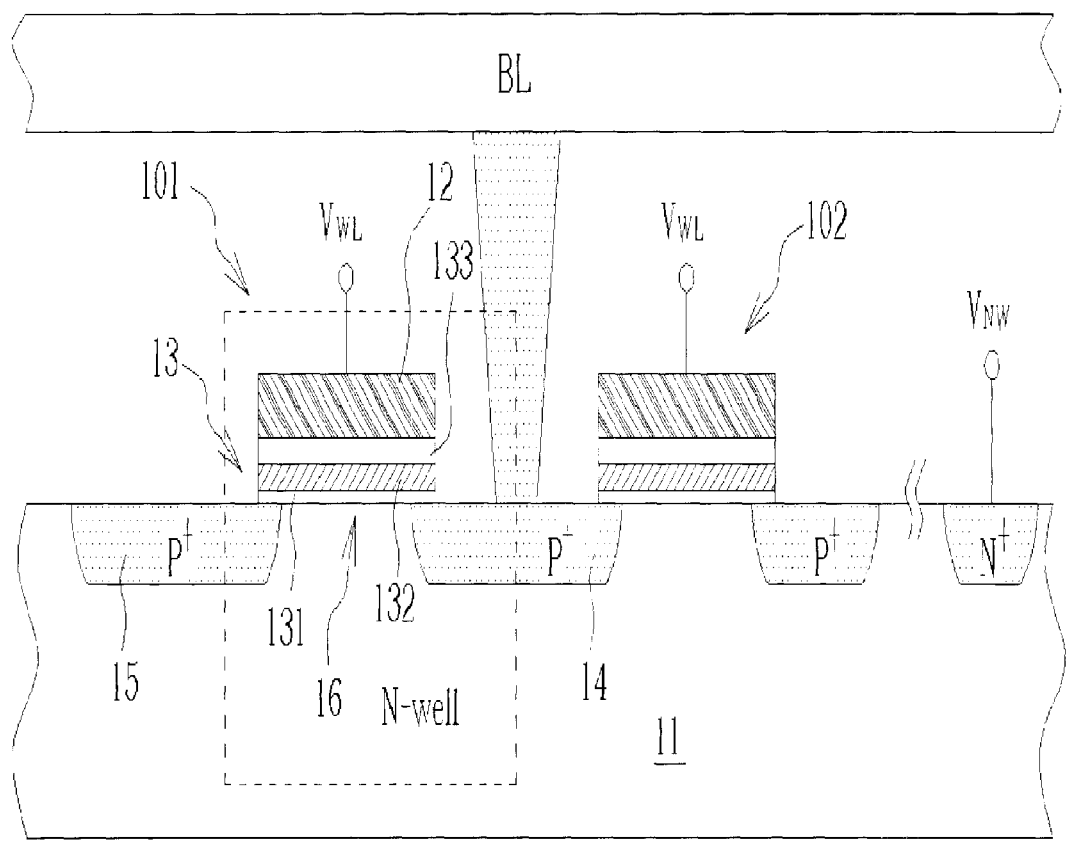
FIG. 2 is a schematic cross-sectional diagram showing the P-channel flash memory cell according to one preferred embodiment of the present invention.
Figure 3:
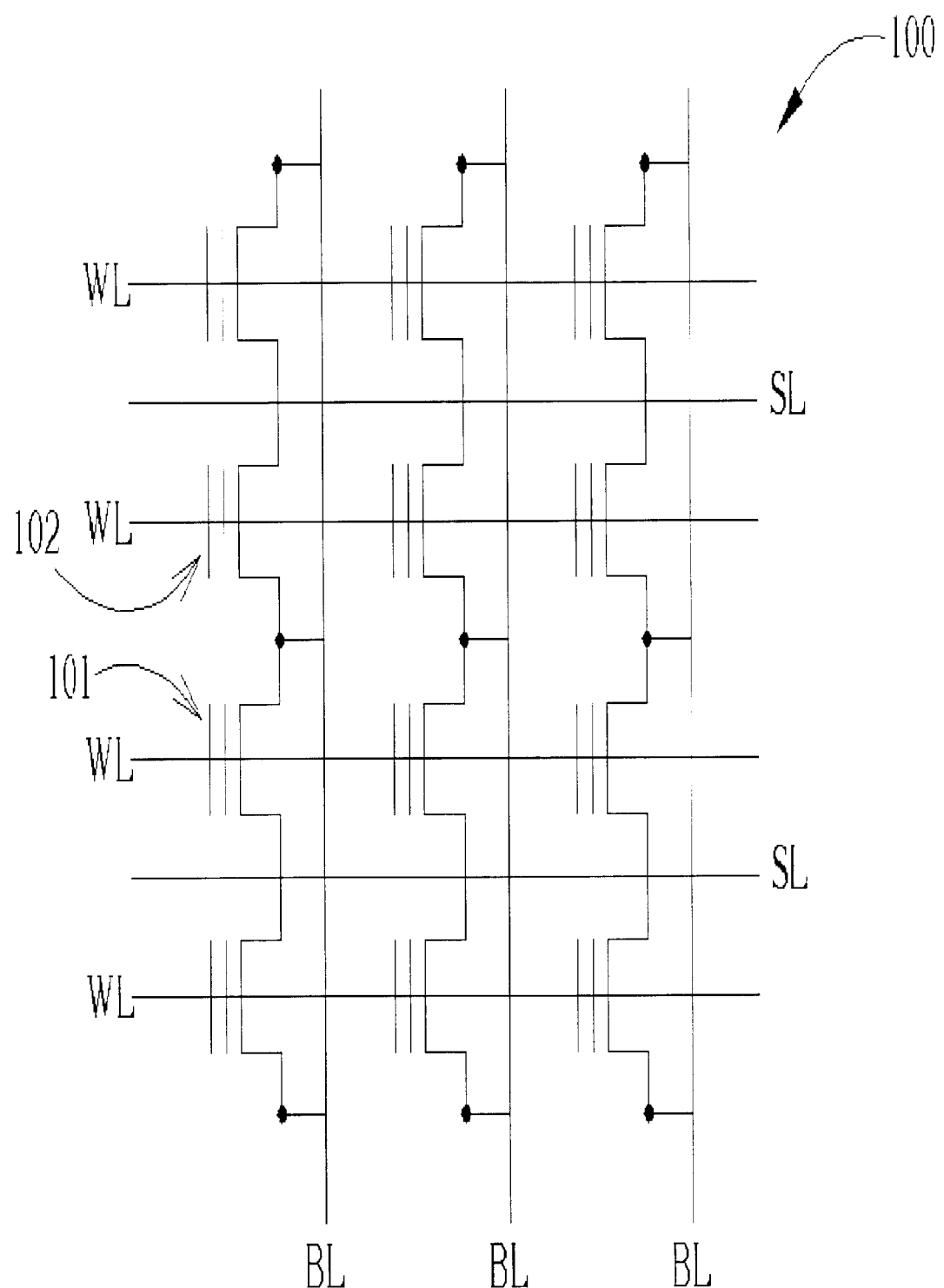
FIG. 3 is an array of the single-transistor P-channel flash memory cells according to the preferred embodiment of the present invention.

I. Structure of the Single-transistor P-channel Flash Memory Cell and an Array thereof According to the Present Invention Please refer to FIGS. 2 and 3. FIG. 2 is a schematic cross-sectional diagram showing the P-channel flash memory cell according to one preferred embodiment of the present invention. FIG. 3 is an array of the single-transistor P-channel flash memory cells according to the preferred embodiment of the present invention. As indicated by the dash line region shown in FIG. 2, the single-transistor P-channel flash memory cell 101 of the present invention is comprised of an N-well 11, an ONO dielectric layer 13 disposed over the N-well 11, a gate 12 located on the ONO dielectric layer 13, a P⁺ doped drain region 14 disposed in the N-well 11 at one side of the gate 12 and is adjacent to the ONO dielectric layer 13, and a P⁺ doped source region 15 disposed in the N-well 11 at the other side of the gate 12 opposite to the P⁺ doped drain region 14. In accordance with the preferred embodiment of the present invention, the N-well 11 is doped in a P substrate 10 using a suitable mask. The gate 12 may be a P⁺ doped polysilicon gate, but not limited thereto. In other embodiments, the gate 12 may be a polycide (poly silicide) gate or a metal gate. The ONO dielectric layer 13 comprises a silicon dioxide bottom layer 131, a charge-trapping silicon nitride layer 132, and a silicon dioxide top layer 133. The P⁺ doped drain region 14 and the P⁺ doped source region 15 define a P channel 16.

As shown in FIGS. 2 and 3, the gate 12 is a part of a word line (WL). As best seen in FIG. 3, the flash memory array of the present invention is comprised of rows of word lines (WL), each of which electrically connects a plurality of gates of single-transistor flash memory cells in one row, and columns of bit lines (BL) intersecting the word lines. The P-channel flash memory cells 101 and 102 in FIG. 2 are located in different rows, but in the same column. The P-channel flash memory cells 101 and 102 are fabricated on the same N-well. In operation, the gate 12 of the P-channel flash memory cell 101 is biased to a word line voltage $V_{WL}$ through the corresponding word line (WL), the P+ doped drain region 14 of the P-channel flash memory cell 101 is biased to a bit line voltage $V_{BL}$ through the corresponding bit line (BL), the P+ doped source region 15 of the P-channel flash memory cell 101 is biased to a source line voltage $V_{SL}$ through the corresponding source line (SL), and the N-well is biased to a well voltage $V_{NW}$. The source line may be a buried diffusion line. It is important to note that the P-channel flash memory cells 101 and 102 share one P+ doped drain region 14.

Figure 14:
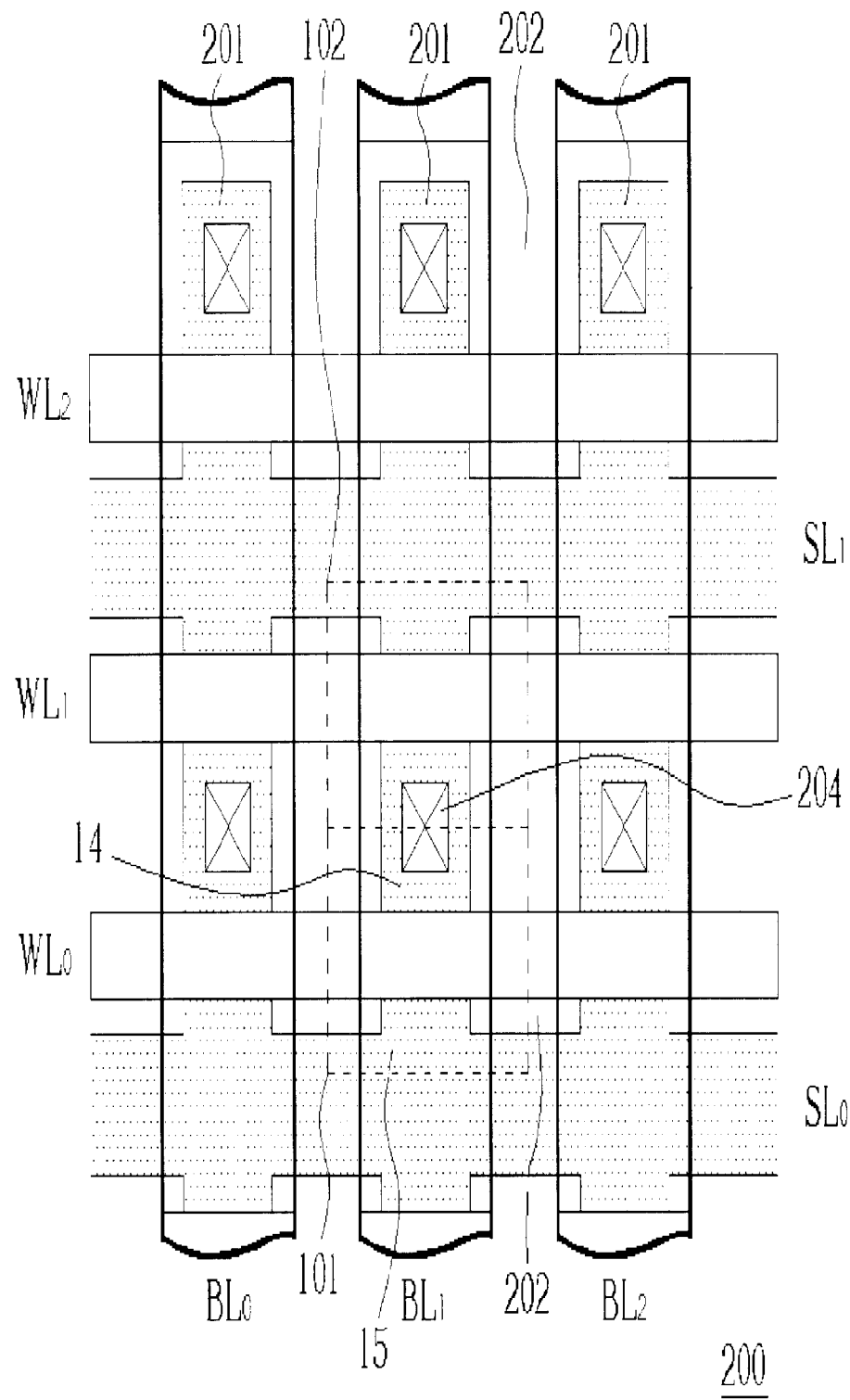
FIG. 14 is an enlarged top view schematically showing a portion of the layout of the P-channel flash memory cell array according to one preferred embodiment of the present invention.

Please refer to FIG. 14. FIG. 14 is an enlarged top view schematically showing a portion of the layout of the P-channel flash memory cell array according to one preferred embodiment of the present invention. As shown in FIG. 14, the memory array layout is comprised of a plurality of active areas 201, a plurality of word lines, for example, $WL_0$, $WL_1$, and $WL_2$, laid on the substrate 200 across each of the active areas 201, and a plurality of bit lines, for example, $BL_0$, $BL_1$, and $BL_2$, intersecting the word lines. The bit lines $BL_0$, $BL_1$, and $BL_2$ are formed on a top surface of an inter-layer dielectric (ILD) layer (not explicitly shown). A buried diffusion source line, for example, source line ($SL_1$), is formed in the substrate 200 between two adjacent word lines: $WL_1$ and $WL_2$. A buried diffusion source line $SL_2$ is formed between two adjacent word lines: $WL_3$ and $WL_4$ (not shown in FIG. 14). In accordance with this preferred embodiment, the active areas 201 and the buried diffusion source lines (such as $SL_0$ and $SL_1$) are formed using the same photo mask (STI mask) and are isolated by shallow trench isolation 202. The buried diffusion source lines and the P+ doped source/drain regions 14 and 15 are formed in the same ion implantation process. An ONO dielectric layer (not explicitly shown) is disposed underneath each of the word lines. Referring briefly back to FIG. 2, the memory cells 101 and 102 are also shown in FIG. 14 as indicated in the two corresponding dash line regions, wherein the P+ doped source region 15 of the P-channel flash memory cell 101 is electrically connected to the source line $SL_0$, and the P+ doped drain region 14 of the P-channel flash memory cell 101 is electrically connected to the bit line $BL_1$ via a contact device 204.

Figure 15:
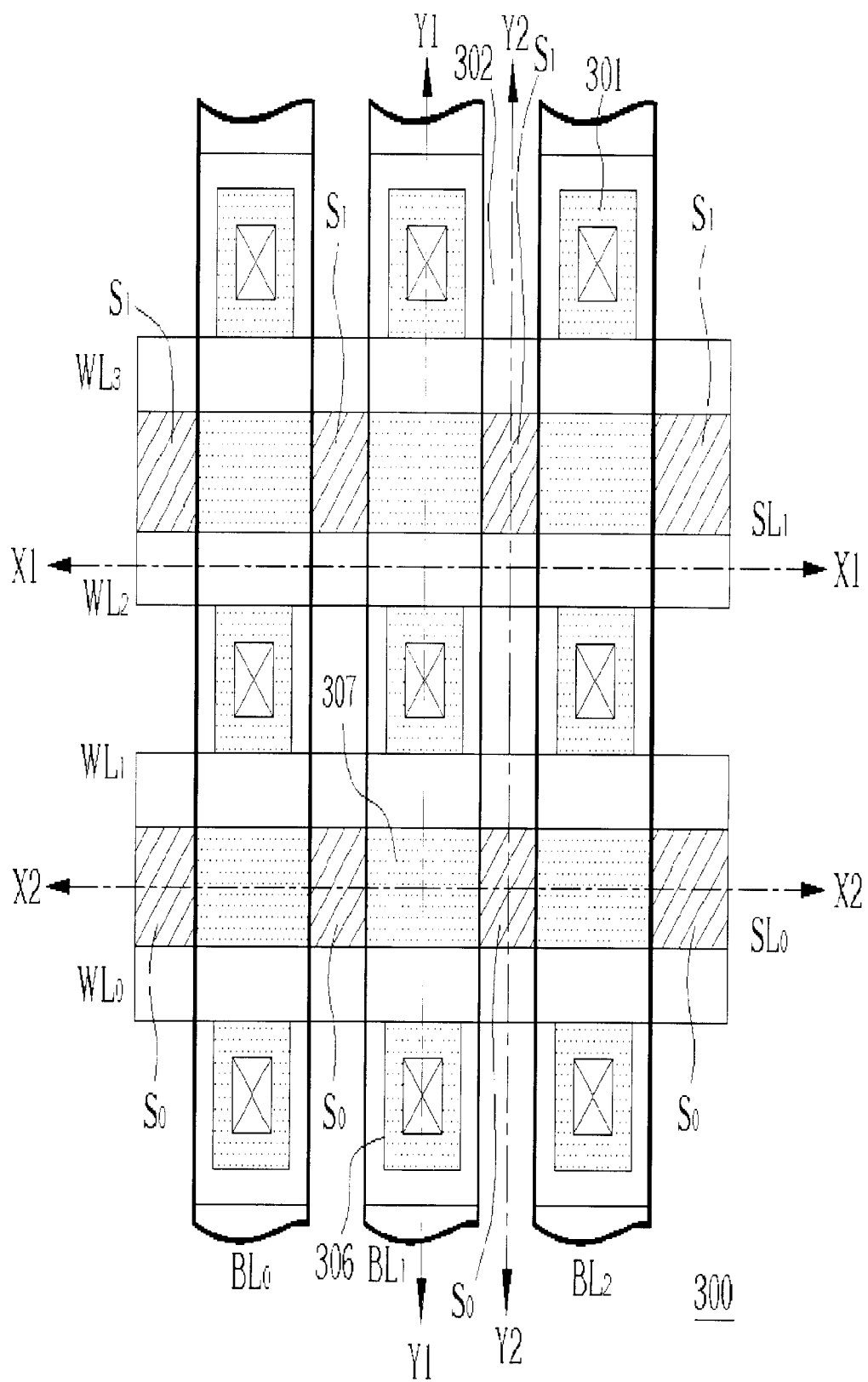
FIG. 15 is an enlarged top view schematically showing a portion of the layout of the P-channel flash memory cell array according to another preferred embodiment of the present invention.

Please refer to FIG. 15. FIG. 15 is an enlarged top view schematically showing a portion of the layout of the P-channel flash memory cell array according to another preferred embodiment of the present invention. As shown in FIG. 15, the memory array layout is comprised of a plurality of active areas 301, a plurality of word lines, for example, $WL_0$, $WL_1$, $WL_2$, and $WL_3$, laid on the substrate 300 across each of the active areas 301, and a plurality of bit lines, for example, $BL_0$, $BL_1$, and $BL_2$, intersecting the word lines. The bit lines $BL_0$, $BL_1$, and $BL_2$ are formed on a top surface of an inter-layer dielectric (ILD) layer (not explicitly shown). The buried diffusion source lines $SL_0$ and $SL_1$ are formed between $WL_0$ and $WL_1$ and between $WL_2$ and $WL_3$, respectively. The active areas 301 are defined by shallow trench isolation 302. It is important to note that the active areas 301 and the buried diffusion source lines are not formed with the same photo mask. An ONO dielectric layer (not explicitly shown) is disposed underneath each of the word lines: $WL_0$, $WL_1$, $WL_2$, and $WL_3$.

Figure 16:
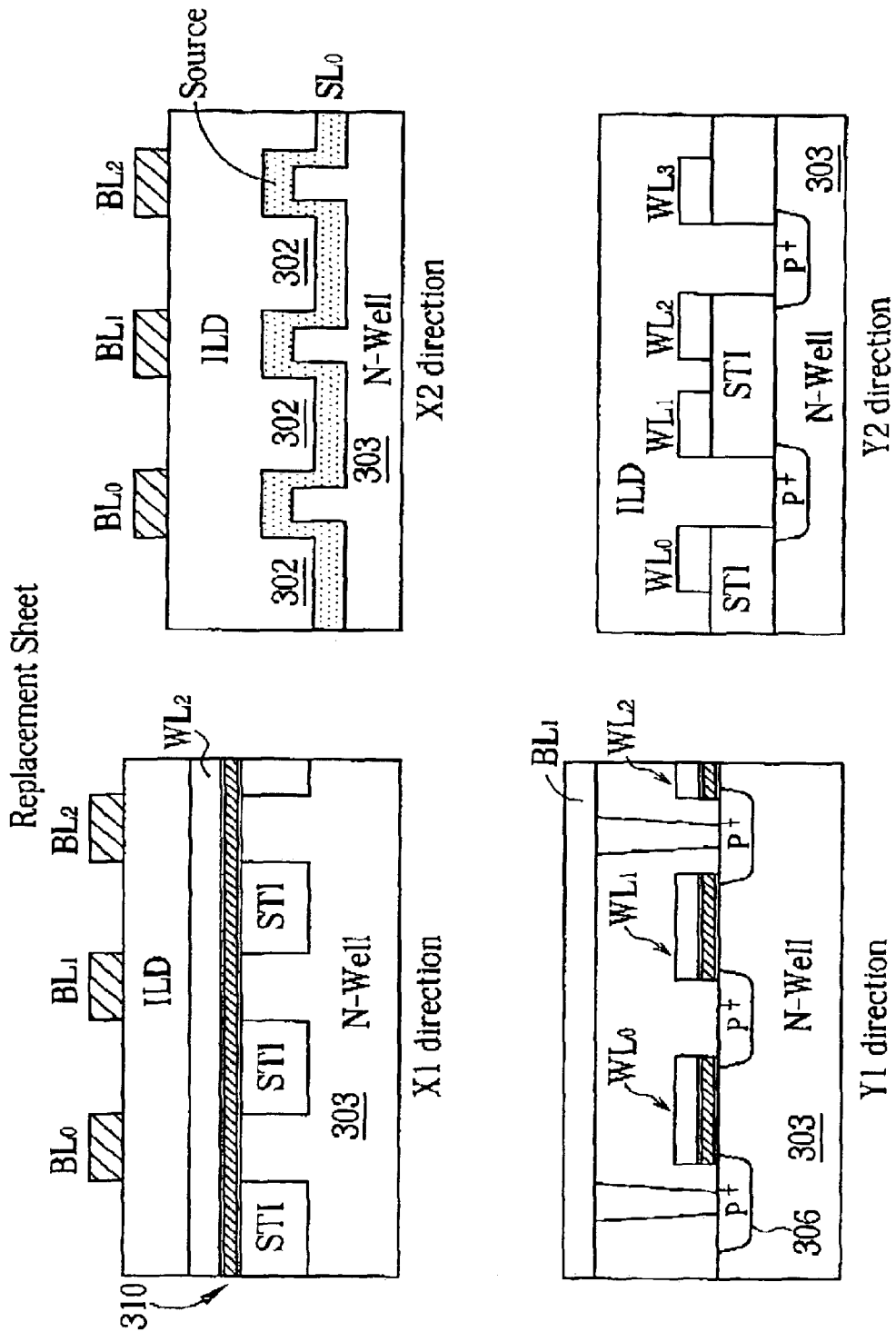
FIG. 16 illustrates the cross sectional views along lines $X_1$, $X_2$, $Y_1$ and $Y_2$ of FIG. 15, respectively.

Please refer to FIG. 16. FIG. 16 illustrates the cross sectional views along lines $X_1$, $X_2$, $Y_1$ and $Y_2$ of FIG. 15, respectively. As shown in FIGS. 15 and 16, in $X_1$ direction, ONO dielectric layer 310 is formed under the word line $WL_2$, which extends across the active areas 301 and shallow trench isolation (STI) 302. In $X_2$ direction, it is seen that the source line $SL_0$ under the STI regions connects the doped source regions 307 of each of the memory cells in one row. An ILD layer is deposited over the substrate. On the top surface of the ILD layer, the bit lines $BL_0$, $BL_1$, and $BL_2$ are formed. As seen in $Y_1$ direction, the drains 306 of the memory cells in one column are electrically connected to bit line $BL_1$. The drains 306 are formed in N well 303. As seen in $Y_2$ direction, the P+ doping region that connects two neighboring P+ doped source regions in two adjacent columns is formed after the STI formation. A portion of the STI region between two neighboring P+ doped source regions, such as $S_0$ and $S_1$ as shown in FIG. 15, is etched away using a suitable mask. After this, P type dopants are implanted in the recessed $S_0$ and $S_1$ regions, follow d by silicide process, ther by forming the source line SL. The recessed regions are then filled with ILD.

Figure 17:
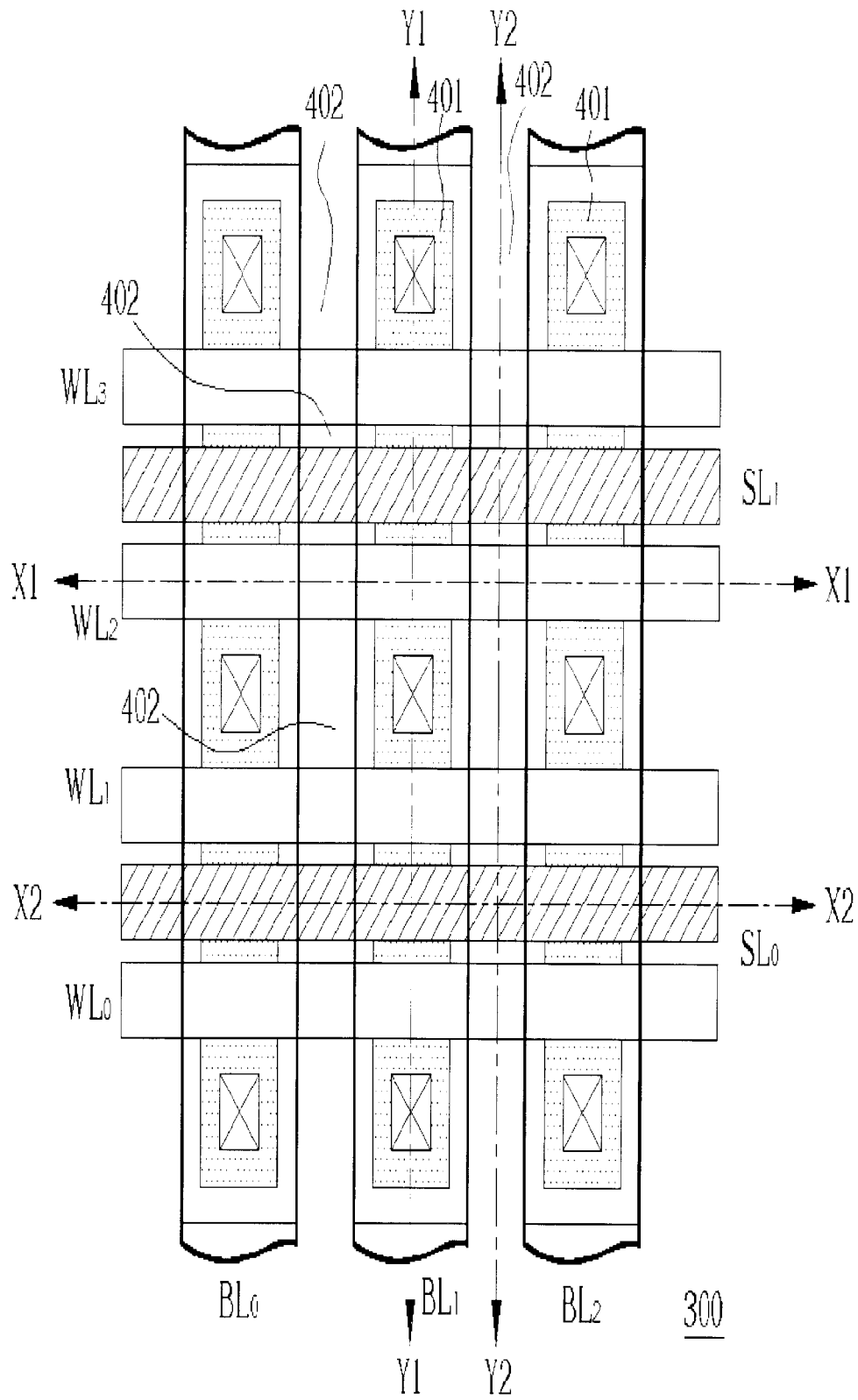
FIG. 17 is an enlarged top view schematically showing a portion of the layout of the P-channel flash memory cell array according to still another preferred embodiment of the present invention.

Please refer to FIG. 17. FIG. 17 is an enlarged top view schematically showing a portion of the layout of the P-channel flash memory cell array according to another preferred embodiment of the present invention. As shown in FIG. 17, the memory array layout comprises a plurality of active areas 401, a plurality of word lines, for example, $WL_0$, $WL_1$, $WL_2$, and $WL_3$, laid on the substrate 400 across each of the active areas 401, and a plurality of bit lines, for example, $BL_0$, $BL_1$, and $BL_2$, intersecting the word lines. The bit lines $BL_0$, $BL_1$, and $BL_2$ are formed on a top surface of an inter-layer dielectric (ILD) layer (not explicitly shown). Local interconnection source lines $SL_0$ and $SL_1$ are formed between $WL_0$ and $WL_1$ and between $WL_2$ and $WL_3$, respectively. The active areas 401 are defined by shallow trench isolation 402. The active areas 401 and the local interconnection source lines $SL_0$ and $SL_1$ are not formed with the same photo mask. The interconnection source lines $SL_0$ and $SL_1$ and the local interconnection are defined at the same time. An ONO dielectric layer (not explicitly shown) is disposed underneath each of the word lines: $WL_0$, $WL_1$, $WL_2$, and $WL_3$.

Figure 18:
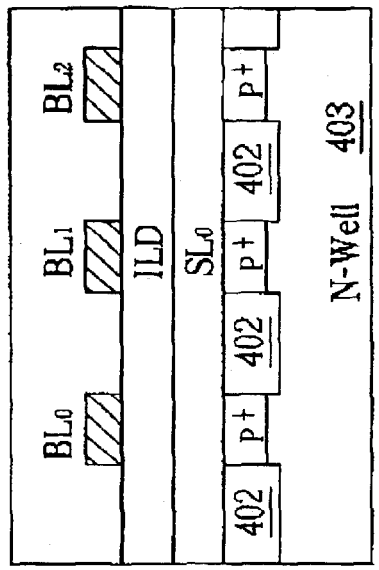
FIG. 18 illustrates the cross sectional views along lines $X_1$, $X_2$, $Y_1$ and $Y_2$ of FIG. 17, respectively.
Figure 18:
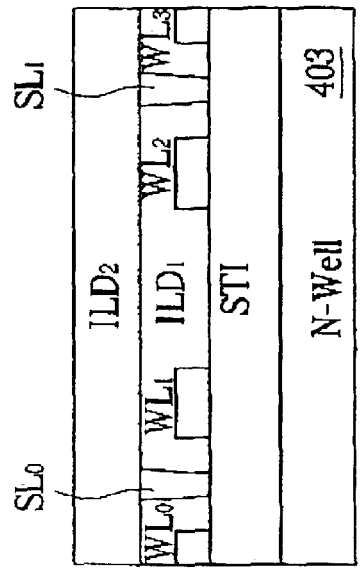
Figure 18:
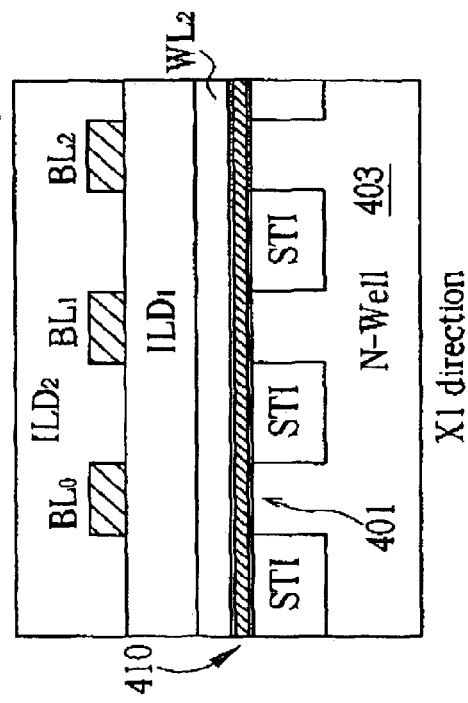
Figure 18:
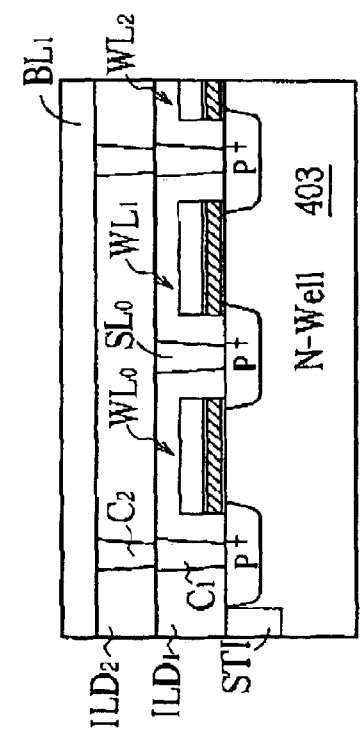

Please refer to FIG. 18. FIG. 18 illustrates the cross sectional views along lines $X_1$, $X_2$, $Y_1$ and $Y_2$ of FIG. 17, respectively. As shown in FIGS. 17 and 18, in $X_1$ direction, ONO dielectric layer 410 is formed under the word line $WL_2$, which extends across the active areas 401 and shallow trench isolation (STI) 402. In $X_2$ direction, the local interconnection (LI) source line $SL_0$ comprising tungsten or metal silicide-connects the P+ doped source regions of the memory cells in the same row. The P+ doped source regions are formed in N well 403. ILD layers ($ILD_1$ and $ILD_2$) are deposited over the substrate. On the top surface of the $ILD_2$, the bit lines $BL_0$, $BL_1$ and $BL_2$ are formed. As seen in $Y_1$ direction, the P+ drains of the memory cells in one column are electrically connected to bit line $BL_1$ through bit line contacts $C_1$ and $C_2$, which are formed in the $ILD_1$ and $ILD_2$, respectively. As seen in $Y_2$ direction, local interconnection source lines $SL_0$ and $SL_1$ are formed between $WL_0$ and $WL_1$ and between $WL_2$ and $WL_3$, respectively.

II. Data Programming, Erasing and Reading Operations of the P-channel Flash Memory According to the Present Invention

EXAMPLE 1

Figure 4:
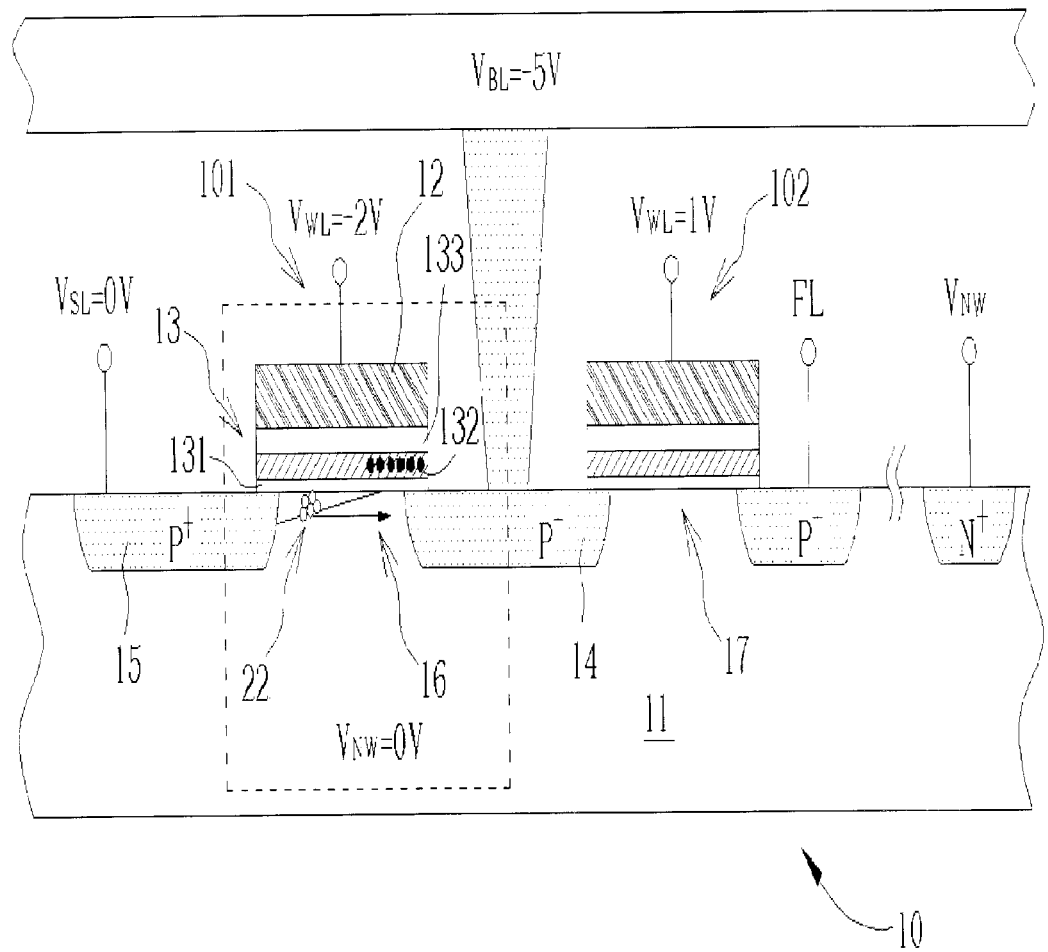
FIG. 4 is a schematic diagram illustrating the program operation according to the preferred embodiment of the present invention.
Figure 5:
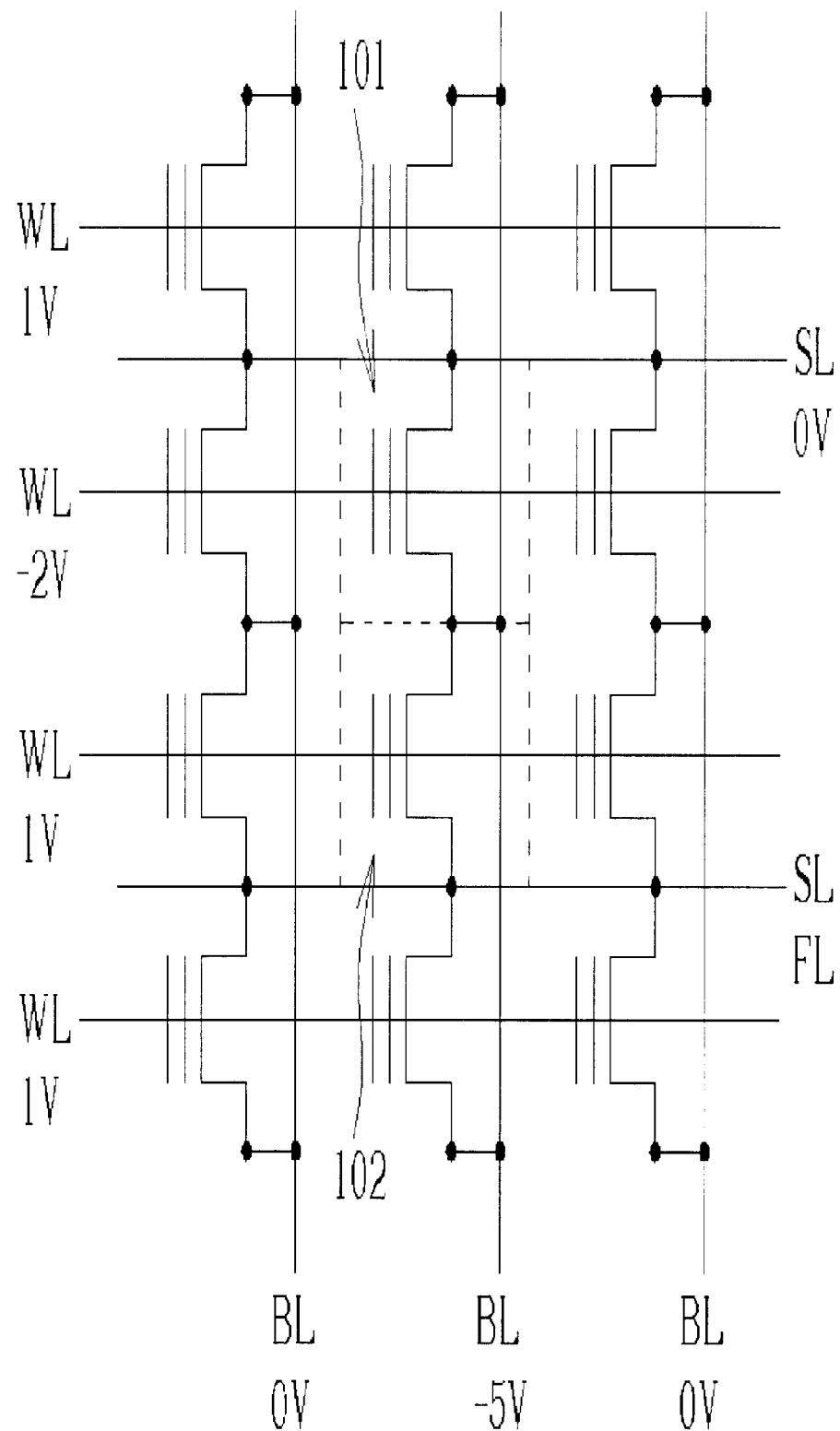
FIG. 5 is a circuit diagram illustrating the program operation according to the preferred embodiment of the present invention.

Program operation through channel hot hole induced hot electron injection mechanism Please refer to FIGS. 4 and 5. FIGS. 4 and 5 are schematic diagrams illustrating the program operation according to the preferred embodiment of the present invention. The present invention features a method for programming PMOS single-transistor memory units. The PMOS single-transistor memory unit 101, as indicated in the dash line region of FIG. 4, is comprised of a silicon dioxide-silicon nitride-silicon dioxide (ONO) dielectric stack 13 disposed on an N-well 11, a P type polysilicon gate 12 disposed on the ONO dielectric stack 13, a P type doped source region 15 disposed in the N-well 11 at one side of the P type polysilicon gate 12, and a P type doped drain region 14 disposed in the N-well 11 on the other side of the P type polysilicon gate 12.

In program operation, the P type polysilicon gate 12 of the PMOS single-transistor memory unit 101 is biased to a word line voltage $V_{WL}$, such as $V_{WL}=-2V$. The P type doped source region 15 is biased to a source line voltage $V_{SL}$ that is greater than the word line voltage $V_{WL}$, for example, $V_{SL}=0V$. The source line voltage $V_{SL}$ is large enough to provide an adequate gate-to-source bias to turn on the P-channel 16 of the PMOS single-transistor memory unit 101. In other words, $$|V_{WL}-V_{SL}|$$

is larger than threshold voltage of the PMOS single-transistor memory unit 101. A bit line voltage $V_{BL}$ is applied to the P type doped drain region 14, wherein the bit line voltage $V_{BL}$ is smaller than the source line voltage $V_{SL}$, for example, $V_{BL}=-5V$. The smaller bit line voltage $V_{BL}$ provides a lateral electric field for the P-channel hot holes 22. The lateral electric field forces the P-channel hot holes 22 passing through the P-channel 16 in an accelerated drift rate to the P type doped drain region 14. The accelerated channel hot holes 22 induce hot electrons near the P type doped drain region 14, some of which inject into the ONO dielectric stack 13. A well voltage $V_{NW}$ is applied to the N-well 11. The well voltage $V_{NW}$ is equal to the source line voltage $V_{SL}$, for example, $V_{NW}=V_{SL}=0V$. The hot electron injection near the P type doped drain region 14, which is induced by channel hot holes, is referred to as "channel hot hole induced hot electron mechanism".

Figure 19:
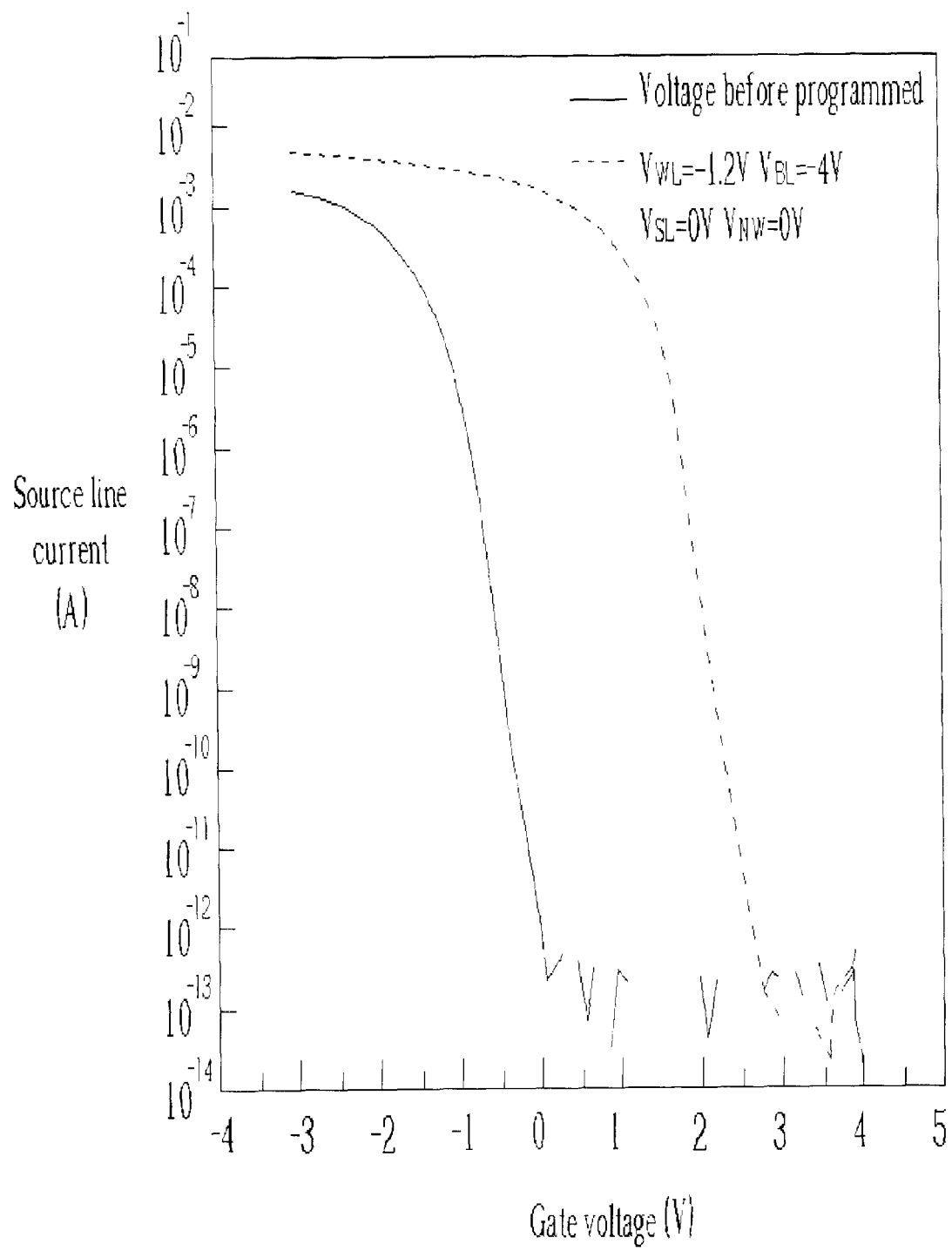
FIG. 19 illustrates the gate voltage shift of the memory cell after performing channel hot hole induced hot electron programming.

Referring to FIG. 19, the gate voltage shift of the PMOS memory cell after performing the above-said channel hot hole induced hot electron program operation is illustrated. In FIG. 19, the gate voltage vs. source line current relation before programming is also plotted, as indicated by solid line curve. The experimental data of FIG. 19 is obtained by measuring the source line current at different gate voltages of the above-said PMOS single-transistor memory cell that is programmed under the following program voltage conditions: $V_{WL}=-1.2V$, $V_{BL}=-4V$, $V_{SL}=0V$, and $V_{NW}=0V$.

As shown in FIG. 5, in program operation, the voltage conditions for the non-selected PMOS single-transistor memory cell 102 that is in the same column as the selected PMOS single-transistor memory cell 101 include: word line voltage $V_{WL}=1V$, floating source (FL), bit line voltage $V_{BL}=-5V$, and well voltage $V_{NW}=0V$. In another embodiment, the source terminal of the above-said non-selected PMOS single-transistor memory cell 102 may be grounded ($V_{SL}=0V$), or $V_{SL}=V_{NW}$. Under such conditions, the P channel 17 of the memory cell 102 will not turn on (i.e., this transistor is in an "OFF" state). The voltage conditions for the non-selected PMOS single-transistor memory cell that is in the same row as the selected PMOS single-transistor memory cell 101 include: word line voltage $V_{WL}=-2V$, grounding source ($V_{SL}=0V$), bit line voltage $V_{BL}=0V$, well voltage $V_{NW}=0V$. Under such conditions, the P-channel of this non-selected transistor will not be turned on. For the non-selected PMOS single-transistor memory cells that are not in the same column and not in the same row as the selected PMOS single-transistor memory cell 101, the voltage conditions include: word line voltage $V_{WL}=1V$, floating source, bit line voltage $V_{BL}=0V$, and well voltage $V_{NW}=0V$. Under such conditions, the P-channel of these non-selected transistors that are not in the same column and not in the same row as the selected PMOS single-transistor memory cell 101 will not be turned on.

It is important to note that all of the operation voltages including word line voltage $V_{WL}$, source line voltage $V_{SL}$, bit line voltage $V_{BL}$, and well voltage $V_{NW}$ can be shifted by a positive value, such as +5V, such that all of the operation voltages are positive voltages. For example, after shifting by +5V, the operation voltages for programming include: word line voltage $V_{WL}=3V$, source line voltage $V_{SL}=5V$, bit line voltage $V_{BL}=0V$, and well voltage $V_{NW}=5V$.

Figure 6:
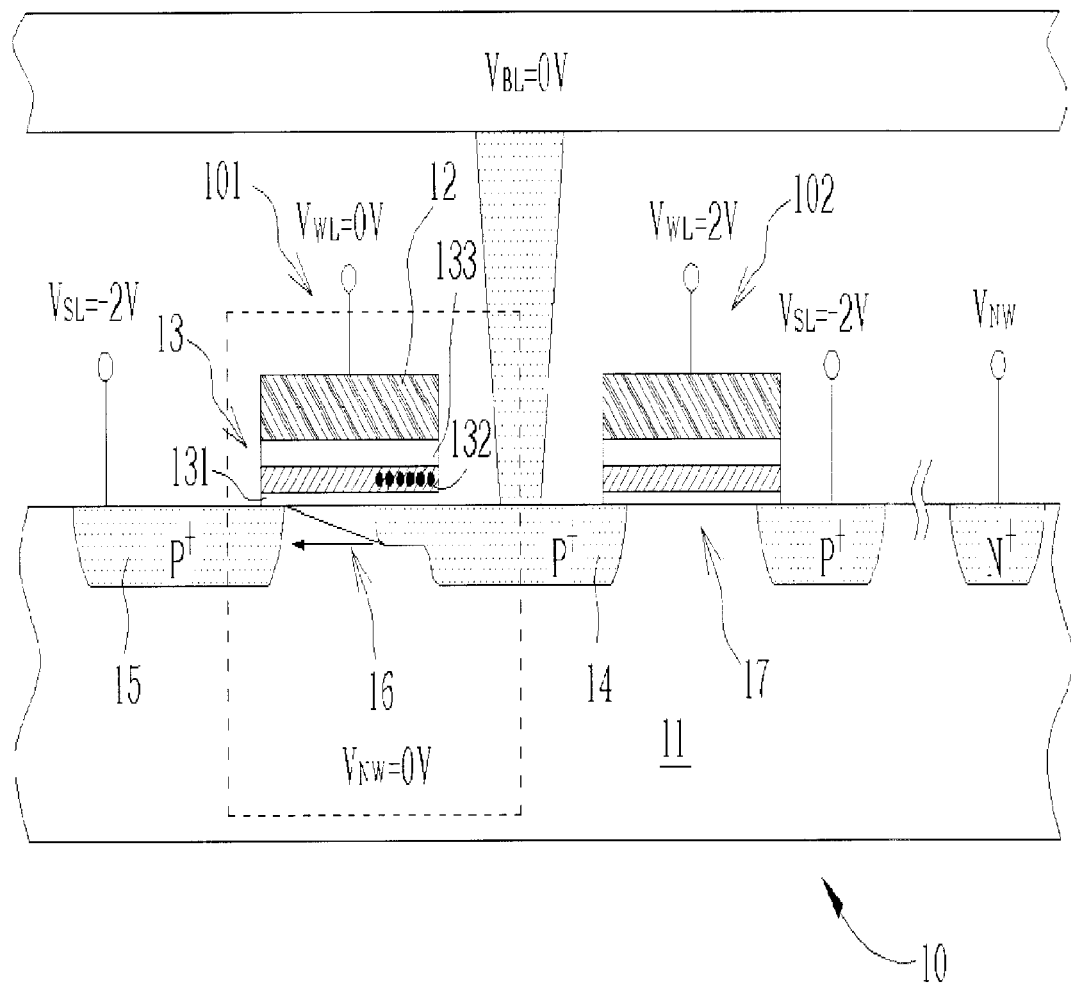
FIG. 6 is a schematic cross-sectional diagram illustrating the read operation according to the preferred embodiment of the present invention.

Read operation Please refer to FIG. 6. FIG. 6 is a schematic cross-sectional diagram illustrating the read operation according to the preferred embodiment of the present invention. As aforementioned, hot electrons are injected and trapped in the ONO dielectric stack 13 near the $P^+$ doped drain region 14. As specifically indicated in FIG. 6, the localized electrons at one side of the ONO dielectric stack 13 extends the $P^+$ doped drain region 14, thereby shortening the channel length 16. Therefore, for those memory cells which are programmed, source-drain punch through current can be detected only by applying a relatively low source line voltage.

Still referring to FIG. 6, in accordance with the preferred embodiment of the present invention, the method for reading the programmed PMOS single-transistor memory cell 101 includes the steps of: applying a word line voltage $V_{WL}$, for example, $V_{WL}=0V$, to the P type polysilicon gate 12 of the PMOS single-transistor memory cell 101, applying a source line voltage $V_{SL}$ to the P type doped source region 15, wherein the source line voltage $V_{SL}$ is smaller than the word line voltage $V_{WL}$, for example, $V_{SL}=-2V$, thereby providing enough gate-to-source bias to turn on the shortened P-channel 16. The P type doped drain region 14 is biased to a bit line voltage $V_{BL}$ that is larger than the source line voltage $V_{SL}$, for example, $V_{BL}=0V$. A well voltage $V_{NW}=V_{BL}=0V$ is applied to the N well.

Figure 7:
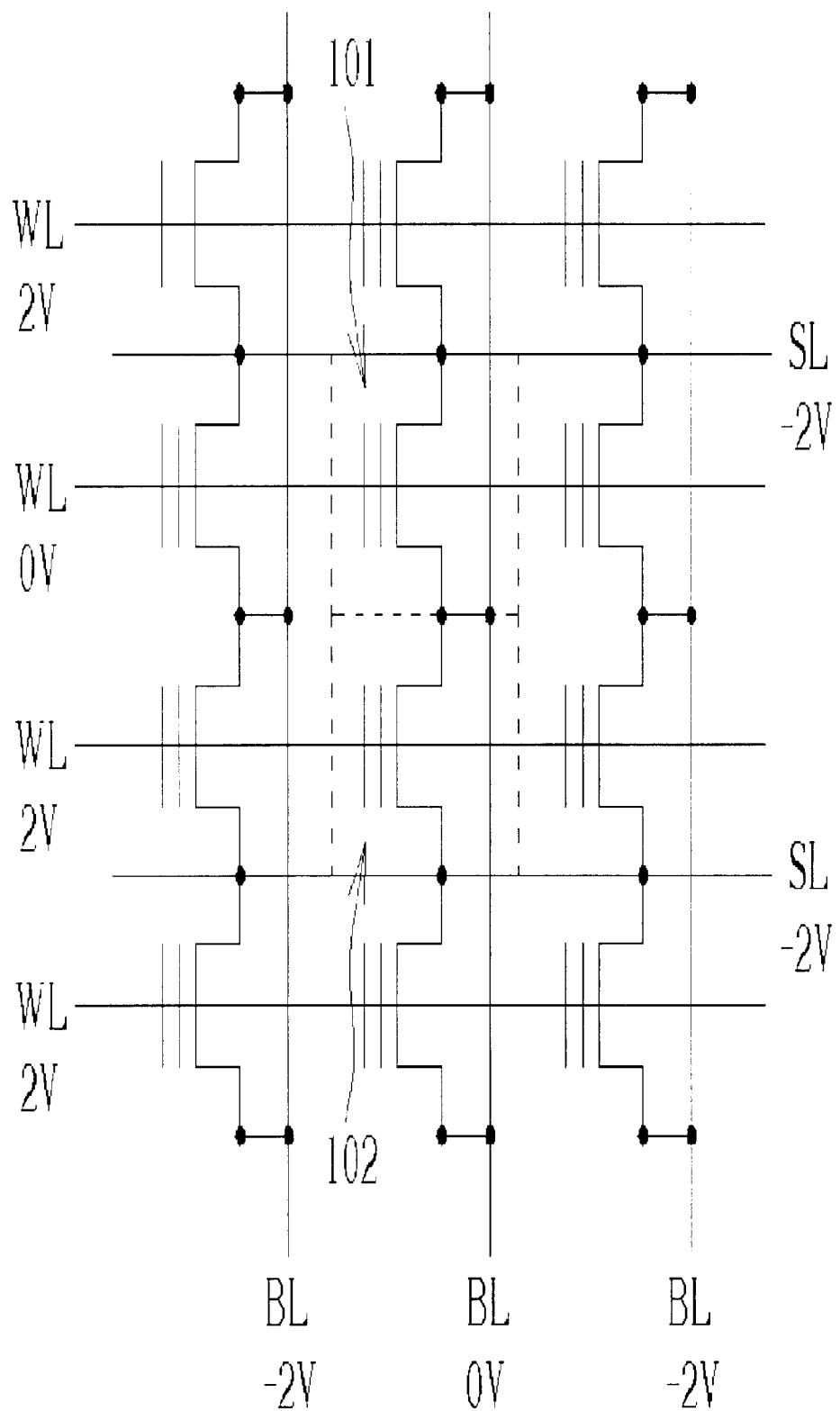
FIG. 7 schematically shows a portion of the memory array under read operation according to the preferred embodiment of the present invention.

FIG. 7 schematically shows a portion of the memory array under read operation according to the preferred embodiment of the present invention. As shown in FIG. 7, the voltage conditions for the non-selected PMOS single-transistor memory cell 102 that is in the same column as the selected PMOS single-transistor memory cell 101 include: word line voltage $V_{WL}=2V$, source line voltage $V_{SL}=-2V$, bit line voltage $V_{BL}=0V$, and well voltage $V_{NW}=0V$. Since there is no electron trapped in the ONO dielectric stack of the PMOS single-transistor memory cell 102, the P-channel of the PMOS single-transistor memory cell 102 will not be turn on under the above-said voltage conditions. The voltage conditions for the non-selected PMOS single-transistor memory cell that is in the same row as the selected PMOS single-transistor memory cell 101 include: word line voltage $V_{WL}=0V$, source line voltage $V_{SL}=-2V$, bit line voltage $V_{BL}=-2V$, well voltage $V_{NW}=0V$. For the non-selected PMOS single-transistor memory cells that are not in the same column and not in the same row as the selected PMOS single-transistor memory cell 101, the voltage conditions include: word line voltage $V_{WL}=2V$, source line voltage $V_{SL}=-2V$, bit line voltage $V_{BL}=-2V$, well voltage $V_{NW}=0V$. Under such conditions, the P-channel of these non-selected transistors that are not in the same column and not in the same row as the selected PMOS single-transistor memory cell 101 will not turn on.

Likewise, all of the operation voltages including word line voltage $V_{WL}$, source line voltage $V_{SL}$, bit line voltage $V_{BL}$, and well voltage $V_{NW}$ can be shifted by a positive value, such as +5V, such that all of the operation voltages are positive voltages.

Erase Operation

Please refer to FIG. 8. FIG. 8 is a voltage condition table including operation voltages for programming, reading and erasing the PMOS single-transistor memory cell according to the preferred embodiment of this invention. The method for erasing the PMOS single-transistor memory cell according to the preferred embodiment of this invention is similar with the prior art techniques. For example, the PMOS single-transistor memory cells of this invention may be erased by Fowler-Nordheim tunneling (FN tunneling) or by UV illumination. In a case that the PMOS single-transistor memory cells of this invention are erased by FN tunneling, as specifically indicated in FIG. 8, the voltage conditions for erase operation include: $V_{WL}=-6V$, $V_{NW}=6V$, and grounding source and drain.

EXAMPLE 2

Program Operation through Band-to-band Tunneling Mechanism

Figure 9:
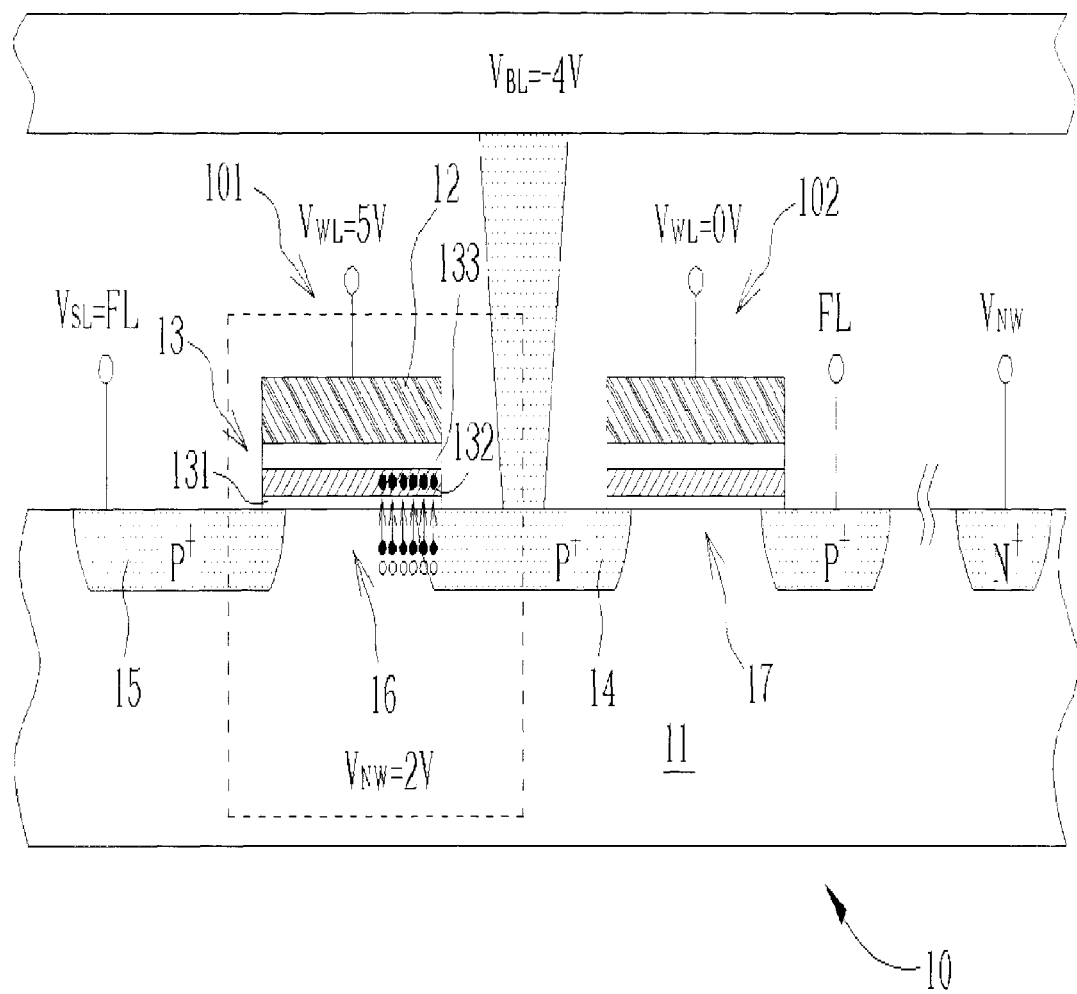
FIG. 9 is a schematic diagram illustrating the program operation according to another preferred embodiment of the present invention.
Figure 10:
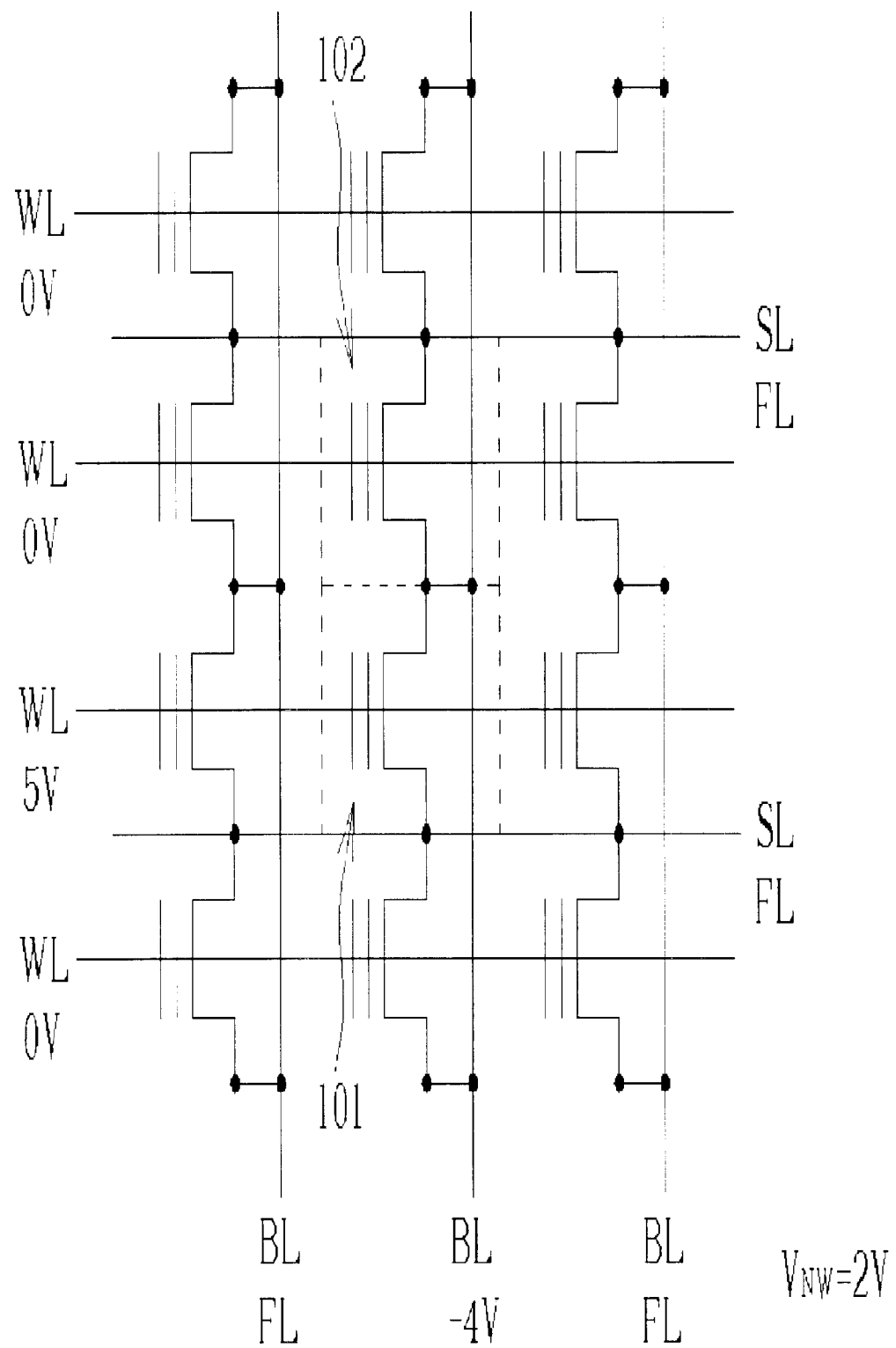
FIG. 10 is a circuit diagram illustrating the program operation according to another preferred embodiment of the present invention.

Please refer to FIGS. 9 and 10. FIGS. 9 and 10 are schematic diagrams illustrating the program operation according to another preferred embodiment of the present invention. The present invention features a method for programming PMOS single-transistor memory units based on band-to-band tunneling (BTBT) mechanism. The PMOS single-transistor memory unit 101, as indicated in the dash line region of FIG. 9, comprises an ONO dielectric stack 13 disposed on an N-well 11, a P type polysilicon gate 12 disposed on the ONO dielectric stack 13, a P type doped source region 15 disposed in the N-well 11 at one side of the P type polysilicon gate 12, and a P type doped drain region 14 disposed in the N-well 11 on the other side of the P type polysilicon gate 12.

Figure 20:
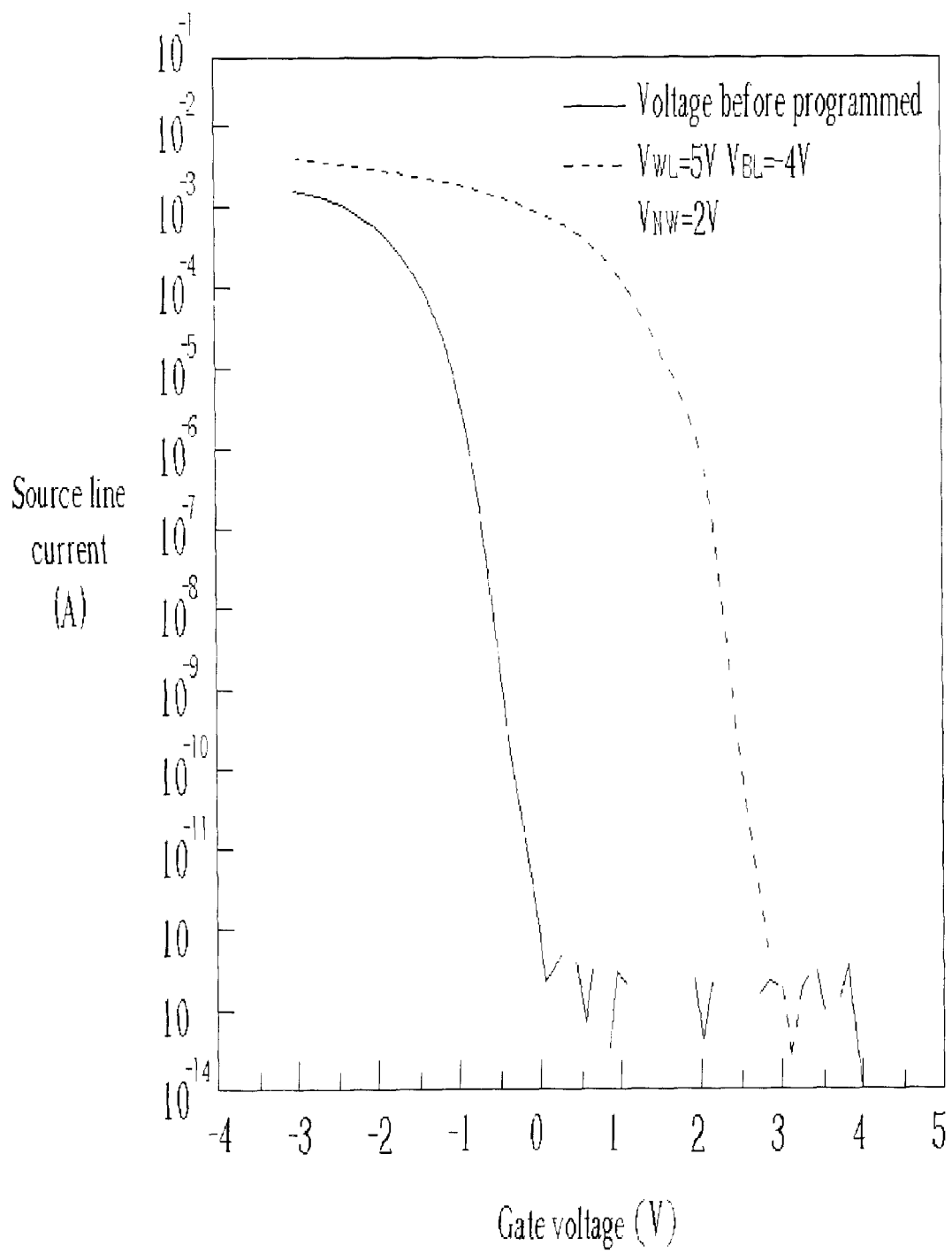
FIG. 20 illustrates the gate voltage shift of the memory cell after performing BTBT programming.

In program operation, the P type polysilicon gate 12 of the PMOS single-transistor memory unit 101 is biased to a word line voltage $V_{WL}>0V$, such as $V_{WL}=5V$. The P type doped source region 15 is floating. A bit line voltage $V_{BL}=-4V$ is applied to the P type doped drain region 14. A well voltage $V_{NW}=2V$ is applied to the N-well 11. Under the above conditions, a band-to-band tunneling (BTBT) injection will occur. Hot electron-hole pairs are generated at the junction between the N well 11 and the P type doped drain region 14, and some of the hot electrons inject into the ONO dielectric stack near the P type doped drain region 14 through BTBT mechanism. Referring to FIG. 20, the gate voltage shift of the PMOS memory cell after performing the above-said BTBT program operation is illustrated. In FIG. 20, the gate voltage vs. source line current relation before programming is also plotted, as indicated by solid line curve. The experimental data of FIG. 20 is obtained by measuring the source line current at different gate voltages of the above-said PMOS single-transistor memory cell that is programmed under the following program voltage conditions: $V_{WL}=5V$, $V_{BL}=-4V$, and $V_{NW}=2V$.

FIG. 10 schematically shows a portion of the memory array under read operation according to this preferred embodiment of the present invention. As shown in FIG. 10, the voltage conditions for the non-selected PMOS single-transistor memory cell 102 that is in the same column as the selected PMOS single-transistor memory cell 101 include: word line voltage $V_{WL}=0V$, floating source line, bit line voltage $V_{BL}=-4V$, and well voltage $V_{NW}=2V$. The voltage conditions for the non-selected PMOS single-transistor memory cell that is in the same row as the selected PMOS single-transistor memory cell 101 include: word line voltage $V_{WL}=5V$, floating source line, floating bit line voltage, and well voltage $V_{NW}=2V$. For the non-selected PMOS single-transistor memory cells that are not in the same column and not in the same row as the selected PMOS single-transistor memory cell 101, the voltage conditions include: word line voltage $V_{WL}=0V$, floating source line and bit line, well voltage $V_{NW}=2V$.

Likewise, all of the operation voltages including word line voltage $V_{WL}$, source line voltage $V_{SL}$, bit line voltage $V_{BL}$, and well voltage $V_{NW}$ can be shifted by a positive value, such as +5V, such that all of the operation voltages are positive voltages.

Read Operation

Figure 11:
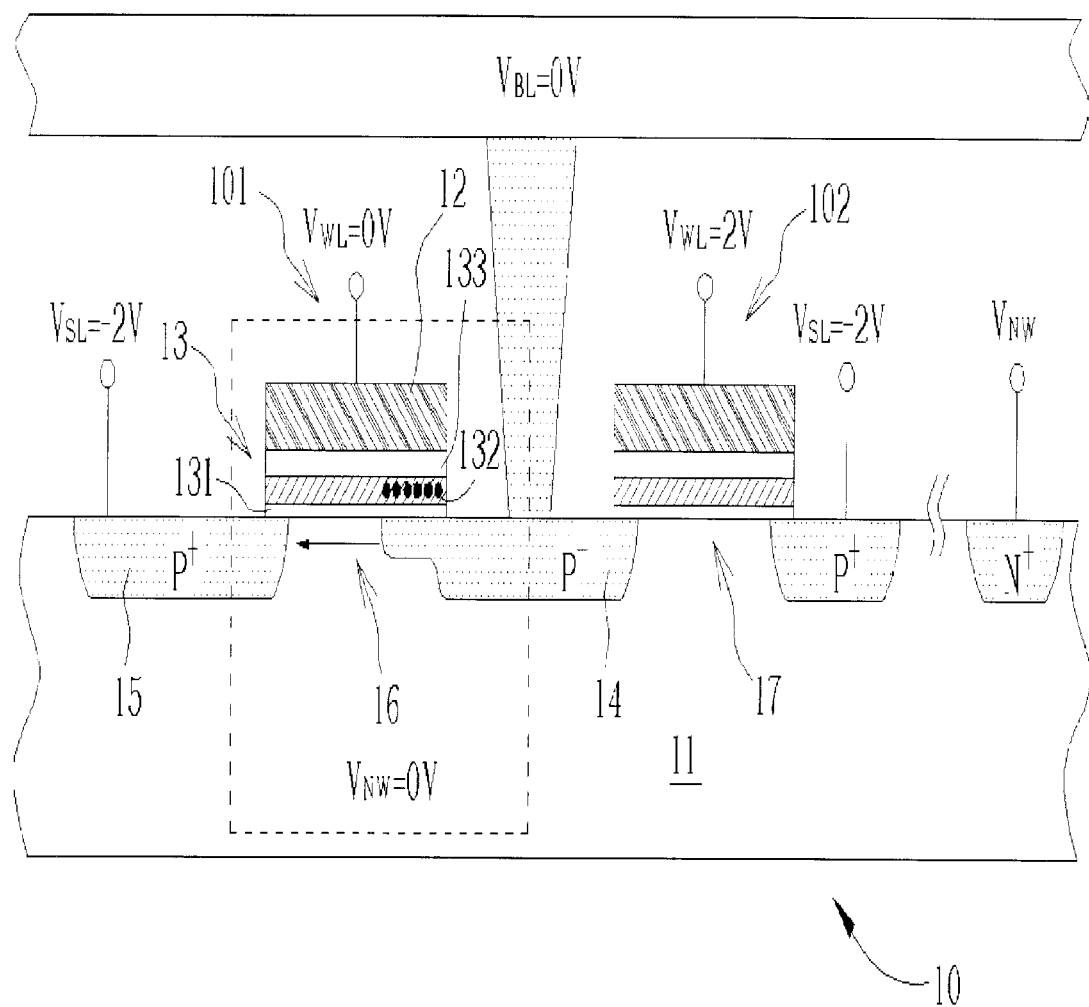
FIG. 11 is a schematic cross-sectional diagram illustrating the read operation according to another preferred embodiment of the present invention.

Please refer to FIG. 11. FIG. 11 is a schematic cross-sectional diagram illustrating the read operation according to another preferred embodiment of the present invention. Electrons are injected and trapped in the ONO dielectric stack 13 near the $P^+$ doped drain region 14. As specifically indicated in FIG. 11, the localized electrons at one side of the ONO dielectric stack 13 extends the $P^+$ doped drain region 14, thereby shortening the channel length 16. Therefore, for those memory cells, which are programmed, source-drain punch through current can be detected only by applying a relatively low source line voltage.

Still referring to FIG. 11, the method for reading the programmed PMOS single-transistor memory cell 101 includes the steps of: applying a word line voltage $V_{WL}$, for example, $V_{WL}=0V$, to the P type polysilicon gate 12 of the PMOS single-transistor memory cell 101, applying a source line voltage $V_{SL}$ to the P type doped source region 15, wherein the source line voltage $V_{SL}$ is smaller than the word line voltage $V_{WL}$, for example, $V_{SL}=-2V$, thereby providing enough gate-to-source bias to turn on the shortened P-channel 16. The P type doped drain region 14 is biased to a bit line voltage $V_{BL}$ that is larger than the source line voltage $V_{SL}$, for example, $V_{BL}=0V$. A well voltage $V_{NW}=V_{BL}=0V$ is applied to the N well.

Figure 12:
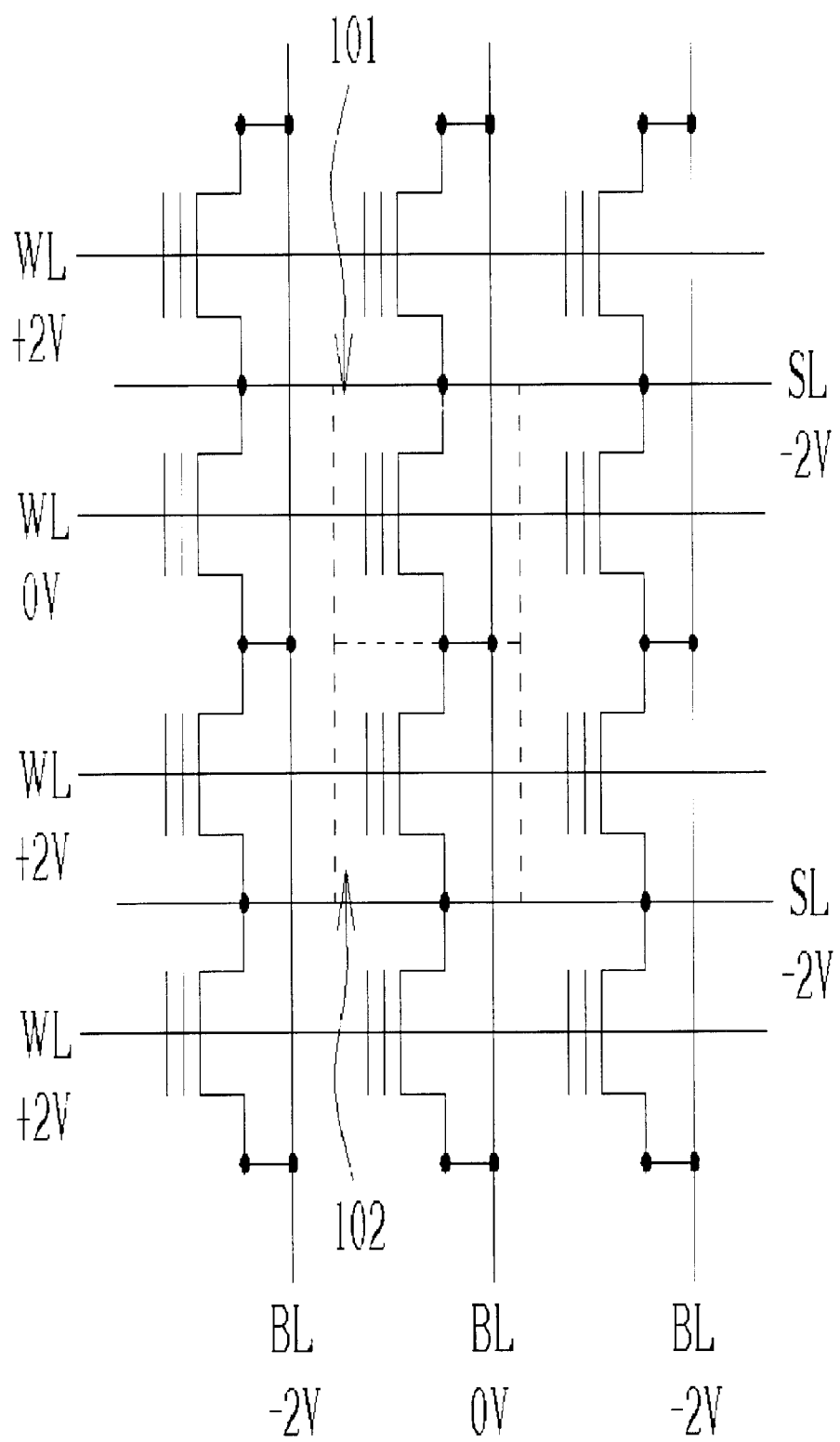
FIG. 12 schematically shows a portion of the memory array under read operation according to another preferred embodiment of the present invention.

FIG. 12 schematically shows a portion of the memory array under read operation according to another preferred embodiment of the present invention. As shown in FIG. 12, the voltage conditions for the non-selected PMOS single-transistor memory cell 102 that is in the same column as the selected PMOS single-transistor memory cell 101 include: word line voltage $V_{WL}=2V$, source line voltage $V_{SL}=-2V$, bit line voltage $V_{BL}=0V$, and well voltage $V_{NW}=0V$. Since there is no electron trapped in the ONO dielectric stack of the PMOS single-transistor memory cell 102, the P-channel 17 of the PMOS single-transistor memory cell 102 will not turn on under the above-said voltage conditions. The voltage conditions for the non-selected PMOS single-transistor memory cell that is in the same row as the selected PMOS single-transistor memory cell 101 include: word line voltage $V_{WL}=0V$, source line voltage $V_{SL}=-2V$, bit line voltage $V_{BL}=-2V$, well voltage $V_{NW}=0V$. For the non-selected PMOS single-transistor memory cells that are not in the same column and not in the same row as the selected PMOS single-transistor memory cell 101, the voltage conditions include: word line voltage $V_{WL}=2V$, source line voltage $V_{SL}=-2V$, bit line voltage $V_{BL}=-2V$, well voltage $V_{NW}=0V$. Under such conditions, the P-channel of these non-selected transistors that are not in the same column and not in the same row as the selected PMOS single-transistor memory cell 101 will not turn on.

Likewise, all of the read operation voltages including word line voltage $V_{WL}$, source line voltage $V_{SL}$, bit line voltage $V_{BL}$, and well voltage $V_{NW}$ can be shifted by a positive value, such as +5V, such that all of the read operation voltages are positive voltages.

Erase Operation

Please refer to FIG. 13. FIG. 13 is a voltage condition table including operation voltages for programming, reading and erasing the PMOS single-transistor memory cell according to another preferred embodiment of this invention. The method for erasing the PMOS single-transistor memory cell according to the preferred embodiment of this invention is similar with the prior art techniques. For example, the PMOS single-transistor memory cells of this invention may be erased by Fowler-Nordheim tunneling (FN tunneling) or by UV illumination. In a case that the PMOS single-transistor memory cells of this invention are erased by FN tunneling, as specifically indicated in FIG. 13, the voltage conditions for erase operation include: $V_{WL}$=−6V, $V_{NW}$=6V, and grounding source and drain.

Those skilled in the art will readily observe that numerous modifications and alterations of the present invention method may be made while retaining the teachings of the invention. Accordingly, the above disclosure should be construed as limited only by the metes and bounds of the appended claims.

What is claimed is:

1. A method for programming a PMOS single-transistor memory unit, said PMOS single-transistor memory unit being comprised of a silicon dioxide-silicon nitride-silicon dioxide (ONO) dielectric stack disposed on an N-well, a P type polysilicon gate disposed on said ONO dielectric stack, a P type doped source region disposed in said N-well at one side of said P type polysilicon gate, and a P type doped drain region disposed in said N-well on the other side of said P type polysilicon gate, the method comprising:

biasing said P type polysilicon gate of said PMOS single-transistor memory unit to a word line voltage $V_{WL}$;

biasing said P type doped source region of said PMOS single-transistor memory unit to a source line voltage $V_{SL}$ that is greater than the word line voltage $V_{WL}$, wherein $|V_{WL}-V_{SL}|$ is larger than threshold voltage of said PMOS single-transistor memory unit, so as to provide an adequate gate-to-source bias to turn on a P-channel of said PMOS single-transistor memory unit;

biasing said P type doped drain region of said PMOS single-transistor memory unit to a bit line voltage $V_{BL}$, wherein said bit line voltage $V_{BL}$ is smaller than said source line voltage $V_{SL}$, so as to provide a lateral electric field for P-channel hot holes, wherein said lateral electric field forces said P-channel hot holes passing through said P-channel in an accelerated drift rate to said P type doped drain region, thereby inducing hot electrons near said P type doped drain region, and wherein some of induced hot electrons are injected into said ONO dielectric stack; and biasing said N-well to a well voltage $V_{NW}$, wherein said well voltage $V_{NW}$ is equal to said source line voltage $V_{SL}$.

2. The method according to claim 1 wherein said hot electron injection occurs near said P type doped drain region, which is induced by channel hot holes, is referred to as "channel hot hole induced hot electron mechanism".

3. The method according to claim 1 wherein said word line voltage $V_{WL}$ is between 0~4V, said source line voltage $V_{SL}$ is between 3~5V, said bit line voltage $V_{BL}$ is 0V, and said well voltage $V_{NW}$ is between 3~5V.

4. The method according to claim 1 wherein said word line voltage $V_{WL}$ is between −1~5V, said source line voltage $V_{SL}$ is 0V, said bit line voltage $V_{BL}$ is between −3~−5V, and said well voltage $V_{NW}$ is between 0V.

5. A method for programming a PMOS single-transistor memory unit, said PMOS single-transistor memory unit comprising a silicon dioxide-silicon nitride-silicon dioxide (ONO) dielectric stack disposed on an N-well, a P type polysilicon gate disposed on said ONO dielectric stack, a P type doped source region disposed in said N-well at one side of said P type polysilicon gate, and a P type doped drain region disposed in said N-well on the other side of said P type polysilicon gate, the method comprising:

biasing said P type polysilicon gate of said PMOS single-transistor memory unit to a word line voltage $V_{WL}$>0V;

floating said P type doped source region of said PMOS single-transistor memory unit; and biasing said P type doped drain region of said PMOS single-transistor memory unit to a bit line voltage $V_{BL}$ and biasing said N-well to a well voltage $V_{NW}$, wherein $V_{NW}-V_{BL}$ bias>0V.

6. The method according to claim 5 wherein said word line voltage $V_{WL}$ is between 2~8V, said bit line voltage $V_{BL}$ is −3~−6V, and said well voltage $V_{NW}$ is between 0~5V.

7. The method according to claim 5 wherein hot-electron-hole pairs is generated ate junction between said N well and said P type doped drain region, and wherein some of said hot electrons are injected into said ONO dielectric stack near said P type doped drain region through band-to-band tunneling (BTBT) mechanism.

8. A method for reading a PMOS single-transistor memory unit, said PMOS single-transistor memory unit being comprised of a silicon dioxide-silicon nitride-silicon dioxide (ONO) dielectric stack disposed on an N-well, a P type polysilicon gate disposed on said ONO dielectric stack, a P type doped source region disposed in said N-well at one side of said P type polysilicon gate, and a P type doped drain region disposed in said N-well on the other side of said P type polysilicon gate, wherein electrons are localized in said ONO dielectric stack near said P type doped drain region, the method comprising:

biasing said P type polysilicon gate of said PMOS single-transistor memory unit to a word line voltage $V_{WL}$;

biasing said P type doped source region of said PMOS single-transistor memory unit to a source line voltage $V_{SL}$ that is smaller than said word line voltage $V_{WL}$ ($V_{SL}<_{WL}$);

biasing said P type doped drain region of said PMOS single-transistor memory unit to a bit line voltage $V_{BL}$ that is greater than said source line voltage $V_{SL}$ ($V_{BL}V>_{SL}$); and biasing said N-well to a well voltage $V_{NW}$, wherein said well voltage $V_{NW}$ is equal to said bit line voltage $V_{BL}$.

9. The method according to claim 8 wherein said word line voltage $V_{WL}$ is 0V, said source line voltage $V_{SL}$ is between −0.5~−2.5V, said bit line voltage $V_{BL}$ is 0V, and said well voltage $V_{NW}$ is between 0V.

10. The method according to claim 8 wherein said word line voltage $V_{WL}$ is 2.5V, said source line voltage $V_{SL}$ is between 0~2V, said bit line voltage $V_{BL}$ is 2.5V, and said well voltage $V_{NW}$ is between 2.5V.

11. A method for operating a PMOS single-transistor memory unit, said PMOS single-transistor memory unit being comprised of a silicon dioxide-silicon nitride-silicon dioxide (ONO) dielectric stack disposed on an N-well, a P type polysilicon gate disposed on said ONO dielectric stack, a P type doped source region disposed in said N-well at one side of said P type polysilicon gate, and a P type doped drain region disposed in said N-well on the other side of said P type polysilicon gate, wherein electrons are localized in said ONO dielectric stack near said P type doped drain region, the method comprising: reading said PMOS single-transistor memory unit, comprising:

biasing said P type polysilicon gate of said PMOS single-transistor memory unit to a word line voltage $V_{WL}$;

biasing said P type doped source region of said PMOS single-transistor memory unit to a source line voltage $V_{SL}$ that is smaller than said word line voltage $V_{WL}$ ($V_{SL} < V_{WL}$);

biasing said P type doped drain region of said PMOS single-transistor memory unit to a bit line voltage $V_{BL}$ that is greater than said source line voltage $V_{SL}$ ($V_{BL} > V_{SL}$); and biasing said N-well to a well voltage $V_{NW}$, wherein said well voltage $V_{NW}$ is equal to said bit line voltage $V_{BL}$;

erasing said PMOS single-transistor memory unit, comprising:

applying a negative erase voltage to said P type polysilicon gate of said PMOS single-transistor memory unit; and applying a positive erase voltage to said N well of said PMOS single-transistor memory unit, thereby erasing said electrons localized in said ONO dielectric stack through Fowler-Nordheim tunneling mechanism.

12. The method according to claim 11 wherein said word line voltage $V_{WL}$ is 0V, said source line voltage $V_{SL}$ is between –0.5~2.5V, said bit line voltage $V_{BL}$ is 0V, and said well voltage $V_{NW}$ is 0V.

13. The method according to claim 11 wherein said word line voltage $V_{WL}$ is 2.5V, said source line voltage $V_{SL}$ is between 0~2V, said bit line voltage $V_{BL}$ is 2.5V, and said well voltage $V_{NW}$ is 2.5V.

14. The method according to claim 11 wherein said negative erase voltage is 6V.

15. The method according to claim 11 wherein said positive erase voltage is +6V.

* * * * *